US012707885B2

(12) United States Patent
Huang et al.

(10) Patent No.: US 12,707,885 B2
(45) Date of Patent: Aug. 11, 2026

(54) DEFECT ENGINEERING IN WIDE BANDGAP PEROVSKITES FOR EFFICIENT AND STABLE FULLY TEXTURED PEROVSKITE-SILICON TANDEM SOLAR CELLS

(71) Applicant: THE UNIVERSITY OF NORTH CAROLINA AT CHAPEL HILL, Chapel Hill, NC (US)

(72) Inventors: Jinsong Huang, Chapel Hill, NC (US); Guang Yang, Chapel Hill, NC (US)

(73) Assignee: THE UNIVERSITY OF NORTH CAROLINA AT CHAPEL HILL, Chapel Hill, NC (US)

( * ) Notice: Subject to any disclaimer, the term of this patent is extended or adjusted under 35 U.S.C. 154(b) by 0 days.

(21) Appl. No.: 18/833,670

(22) PCT Filed: Jan. 25, 2023

(86) PCT No.: PCT/US2023/061233

§ 371 (c)(1),
(2) Date: Jul. 26, 2024

(87) PCT Pub. No.: WO2023/147338

PCT Pub. Date: Aug. 3, 2023

(65) Prior Publication Data

US 2025/0248296 A1 Jul. 31, 2025

Related U.S. Application Data

(60) Provisional application No. 63/362,431, filed on Apr. 4, 2022, provisional application No. 63/267,276, filed on Jan. 28, 2022.

(51) Int. Cl.
*H10K 85/50* (2023.01)
*C09D 11/033* (2014.01)
(Continued)

(52) U.S. Cl.
CPC .......... *H10K 85/50* (2023.02); *C09D 11/033* (2013.01); *C09D 11/037* (2013.01); *C09D 11/52* (2013.01);
(Continued)

(58) Field of Classification Search
None
See application file for complete search history.

(56) References Cited

U.S. PATENT DOCUMENTS

| | | | |
|---|---|---|---|
| 9,305,715 | B2 | 4/2016 | Rwin et al. |
| 2017/0309408 | A1 | 10/2017 | Hayakawa et al. |

FOREIGN PATENT DOCUMENTS

| | | | |
|---|---|---|---|
| EP | 3 916 821 | A1 | 12/2021 |
| WO | WO 2020/130318 | A1 | 6/2020 |

OTHER PUBLICATIONS

Wang et al., Adv. Mater., 2019, 31, 1808357. (Year: 2019).*
(Continued)

*Primary Examiner* — Eli S Mekhlin
(74) *Attorney, Agent, or Firm* — Alston & Bird LLP

(57) ABSTRACT

Described herein are perovskite ink solutions comprising a composition of Formula I ($APbI_{3-z}Br_z$), a tribromide salt, and a solvent, wherein z is defined herein. Further described are perovskite films prepared using the ink solutions, methods for preparing the perovskite films, and use of the films in wide band gap single junction and tandem solar cells. As shown herein, solar cells fabricated using the perovskite films prepared from ink solutions comprising a tribromide salt achieve enhanced efficiency compared to solar cells comprising a perovskite film prepared without the tribromide salt.

14 Claims, 14 Drawing Sheets

(51) Int. Cl.

| | |
|---|---|
| ***C09D 11/037*** | (2014.01) |
| ***C09D 11/52*** | (2014.01) |
| ***H10F 77/70*** | (2025.01) |
| ***H10K 30/10*** | (2023.01) |
| ***H10K 30/57*** | (2023.01) |
| ***H10K 85/10*** | (2023.01) |
| ***H10K 85/20*** | (2023.01) |
| ***H10K 85/60*** | (2023.01) |

(52) U.S. Cl.
CPC ........... *H10F 77/703* (2025.01); *H10K 30/10* (2023.02); *H10K 30/57* (2023.02); *H10K 85/111* (2023.02); *H10K 85/211* (2023.02); *H10K 85/658* (2023.02)

(56) References Cited

OTHER PUBLICATIONS

Lopez et al., "Crystal structure features of CH3NH3Pbl3-xBrx hybrid perovskites prepared by ball milling: route to more stable materials," Cryst Eng Comm, 22:767-775, (2020).
Qiu et al., "Recent Advances in Improving Phase Stability of Perovskite Solar Cells," Small Methods, 4:1900877, (2020).
WIPO Application No. PCT/US2023/061233, PCT International Search Report and Written Opinion of the International Searching Authority mailed Sep. 6, 2023.

* cited by examiner

A

B

DEFECT ENGINEERING IN WIDE BANDGAP PEROVSKITES FOR EFFICIENT AND STABLE FULLY TEXTURED PEROVSKITE-SILICON TANDEM SOLAR CELLS

CROSS REFERENCE TO RELATED APPLICATIONS

This application is a national phase entry of International Application No. PCT/US2023/061233, filed Jan. 25, 2023, which claims the benefit of and priority to U.S. Provisional Application No. 63/362,431, filed on Apr. 4, 2022, and 63/267,276, filed on Jan. 28, 2022, the entire contents of each are incorporated herein by reference.

GOVERNMENT SUPPORT

This invention was made with government support under Grant No. DE-EE0008749 awarded by the Department of Energy. The government has certain rights in the invention.

FIELD

The presently disclosed subject matter relates generally to perovskite ink solutions, perovskite films prepared from the ink solutions, and solar cells comprising the perovskite films.

BACKGROUND

Modern civilization depends greatly on fossil fuels, including petroleum oil, coal, natural gas, etc., and nuclear energy for meeting various energy needs. Energy demand is increasing rapidly because of the quick growth in the human population and a rising living standard. Finite fossil fuel resources and an increasing atmospheric concentration of greenhouse gases, which may be linked to global warming, air pollution, and health problems, are critical global challenges. Problems associated with nuclear energy include security as well as disposal of radioactive fission by-products.

In recent years, the use of renewable energy resources such as solar, hydropower, wind, and biomass has progressed, owing to several advantages over fossil fuels and nuclear energy. Amongst the so-called renewables, solar energy offers clean and abundant energy resources to human beings, which are being constantly replenished on a geological time horizon. Every minute, the sun irradiates the earth with enough energy to supply sufficient power for human needs for a year.

Solar photovoltaic power research is proceeding on two fronts: making cheaper solar photovoltaic devices; and enhancing efficiency. Solar photovoltaic cells for terrestrial applications are typically made from inorganic semiconductor materials, e.g. Si, GaAs, CIGS (CuInGaSe), etc., which absorb a large percentage of solar radiation and convert it to electricity. The cost of solar photovoltaic energy is higher than the grid supply due to the costs of materials and processing.

Since the development of organic semiconductors, research and development efforts have been made into the development of low-cost solar cells using organic materials or combinations of organic and inorganic materials. Recently, organic-inorganic perovskite materials have attracted more attention for their use as solar radiation absorbers. The efficiency of perovskite solar cells (PSCs) has risen steeply. The perovskite active layer combines the promise of solution processing with the ability to tailor the band-gap through ion substitution. Associated with their photovoltaic performance, perovskite also exhibits high fractions of radiative recombination, with apparent carrier lifetimes of 250 ns or longer. Although perovskite provides a unique combination of properties such as strong optical absorption, long diffusion length, and solution processability enabled by the relatively benign nature of intrinsic defects, perovskite absorbs the solar spectrum only up to about 800 nm. Moreover, perovskite has stability issues against UV radiation and moisture. To utilize a wide solar spectrum, a multi-junction/tandem structure is needed. The perovskite is typically used as the top cell in combination with the bottom cell of Si or CIGS (CuInGaSe) to make the tandem solar cell.

Multi-junction solar cells contain two or more single-junction solar cells in tandem based on different semiconductors. This arrangement can increase the incident photon-to-electricity conversion efficiency by separating the absorption of the polychromatic solar spectrum into different band-gaps. The largest band-gap solar cell is at the top and the band-gap decreases from top to bottom. In such a structure, the higher energy (shorter wavelength) photons are absorbed in the top (and lower) energies by the bottom cell. In this way, a wide range of solar radiation wavelengths can be absorbed and thereby provide increased output.

Several limitations have been encountered in current research on perovskite-silicon tandem solar cells, such as short charge-carrier diffusion length and overall low power conversion efficiencies. As such, what is needed in the art are strategies for enhancing perovskite tandem solar cells, including perovskite-tandem solar cells. The subject matter described herein addresses this unmet need.

BRIEF SUMMARY

In one aspect, the presently disclosed subject matter is directed to an ink solution, comprising:

(i) a composition of Formula I:

$$APbI_{3-z}Br_z \quad (I),$$

wherein,

A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), and guanidinium (GU), or a combination thereof; and z is between 0.01 and 1.0;

(ii) a tribromide salt;

and (iii) a solvent.

In another aspect, the presently disclosed subject matter is directed to a method for preparing a perovskite film using the ink solutions described herein, comprising: contacting an ink solution using a fast coating process onto a substrate to form a film, wherein the fast coating process is selected from the group consisting of blade coating, slot die coating, shear coating, gravure coating, brush coating, syringe coating, and screen printing.

In another aspect, the presently disclosed subject matter is directed to a perovskite film comprising:

(i) a composition of Formula I:

$$APbI_{3-z}Br_z \quad (I),$$

wherein,

A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), and guanidinium (GU), or a combination thereof; and z is between 0.01 and 1.0; and (ii) a tribromide salt.

In another aspect, the presently disclosed subject matter is directed to a wide band gap perovskite solar cell, comprising a perovskite film described herein.

In another aspect, the presently disclosed subject matter is directed to a solar cell comprising:

one or more transparent conductive oxide layers;

one or more conductive electrode layers; and one or more active layers, wherein at least one of said one or more active layers is a wide band gap material comprising a perovskite film described herein.

In another aspect, the presently disclosed subject matter is directed to a method of improving the efficiency of a wide band gap solar cell, comprising:

incorporating an enhanced perovskite film into a wide band gap solar cell;

wherein the enhanced perovskite film comprises:

(i) a composition of Formula I $$APbI_{3-z}Br_z \quad (I),$$

wherein,

A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), and guanidinium (GU), or a combination thereof; and z is between 0.01 and 1.0;

and (ii) a tribromide salt;

wherein the tribromide salt is present in the enhanced perovskite film at a molar ratio of about 0.05 to about 1.0% relative to the composition of Formula (I); and wherein the efficiency of the wide band gap solar cell is improved relative to a wide band gap solar cell comprising a perovskite film of Formula I that lacks the tribromide salt.

These and other aspects are described herein.

Figure 16:
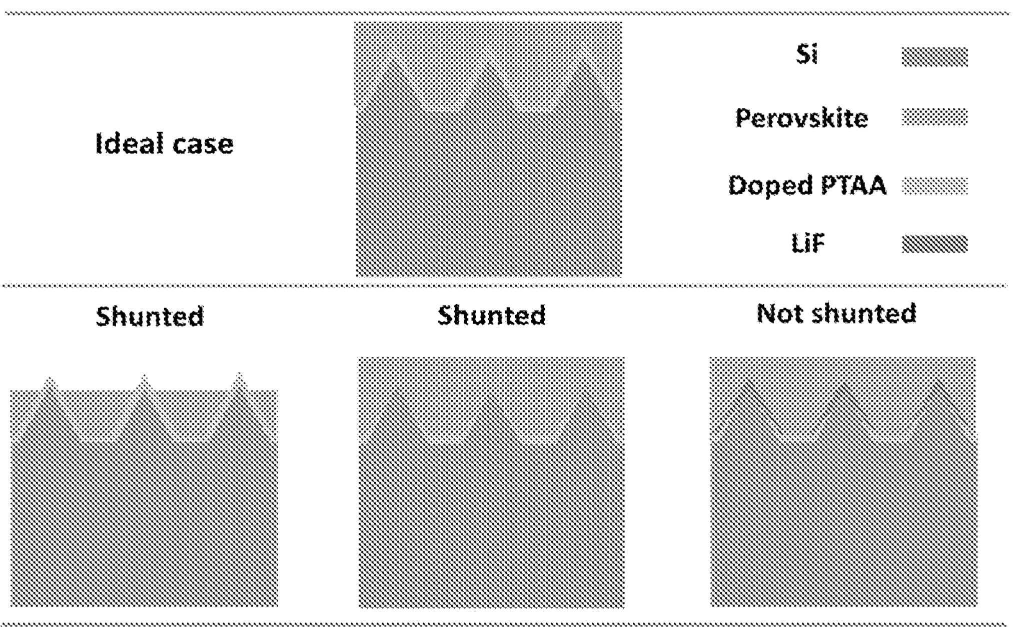

FIG. 16 shows an illustration of shunting pathways in perovskite/textured silicon tandem devices.

Figure 17:
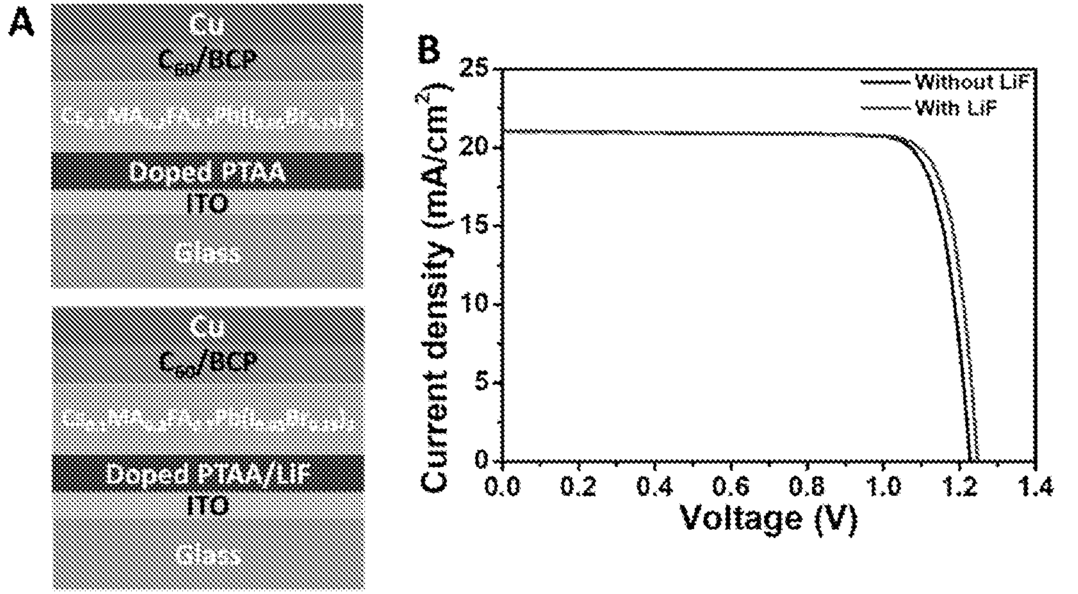

FIG. 17 shows (A) schematic diagram of semitransparent perovskite solar cells without and with a LiF interlayer; and (B) J-V characteristics of semitransparent perovskite solar cells.

Figure 18:
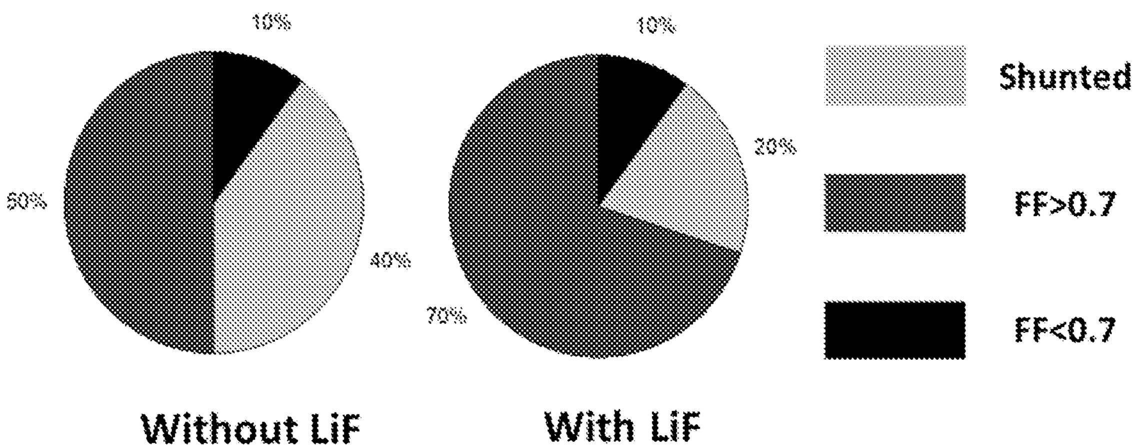

FIG. 18 shows a schematic of a yield comparison of tandem devices fabricated with and without LiF interlayer (20 devices in each group).

Figure 19:
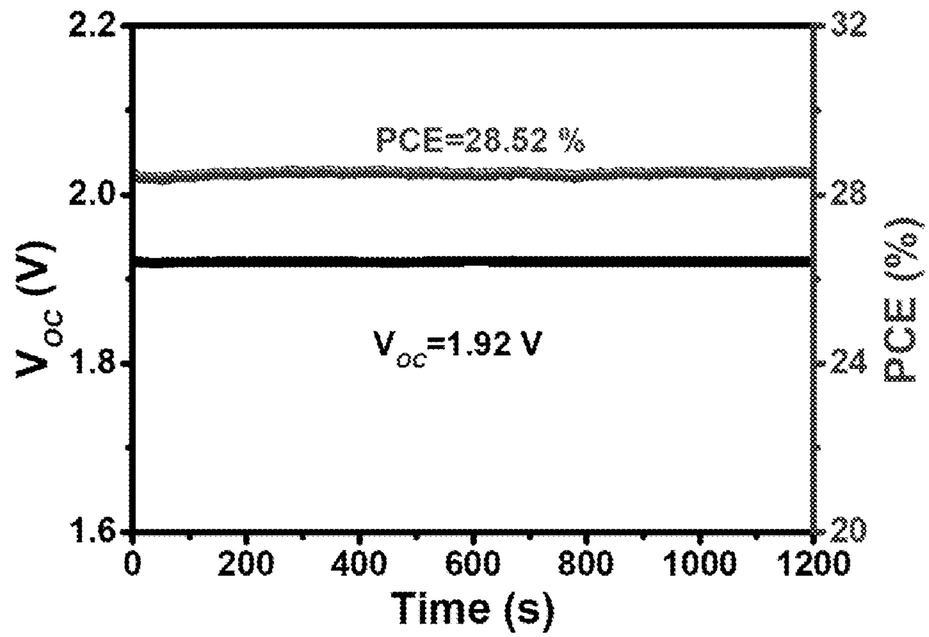

FIG. 19 shows a plot of stabilized $V_{OC}$ and PCE of a champion tandem solar cell.

Figure 20:
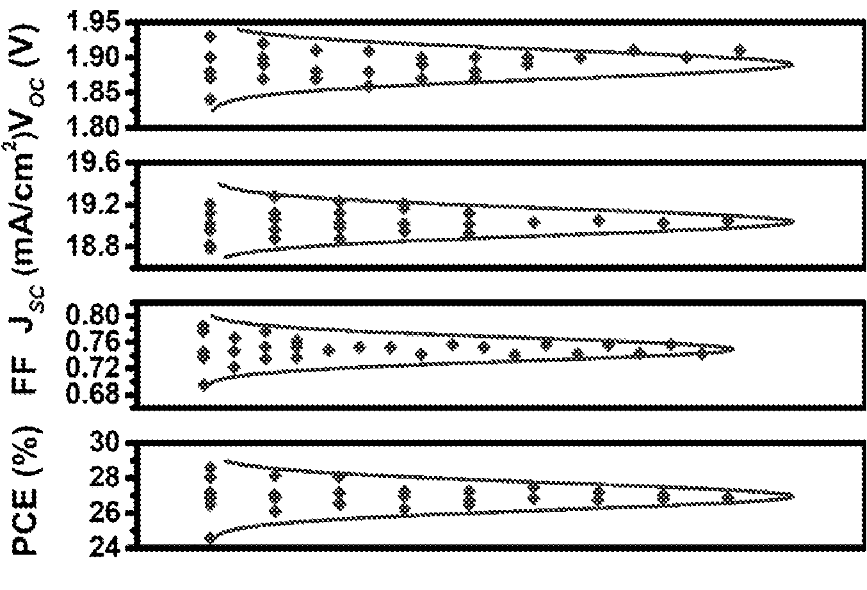

FIG. 20 shows statistic photovoltaic parameters of 27 tandem solar cells.

Figure 21:
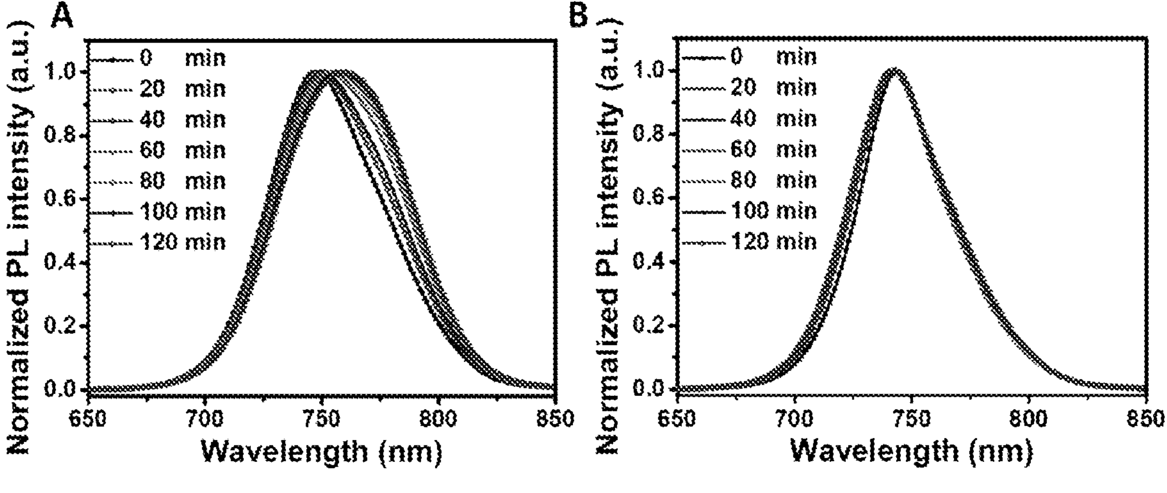

FIG. 21 shows steady-state PL spectra of WBG perovskite films with (A) and without (B) $TPABr_3$ under 10-sun illumination for 120 min.

Figure 22:
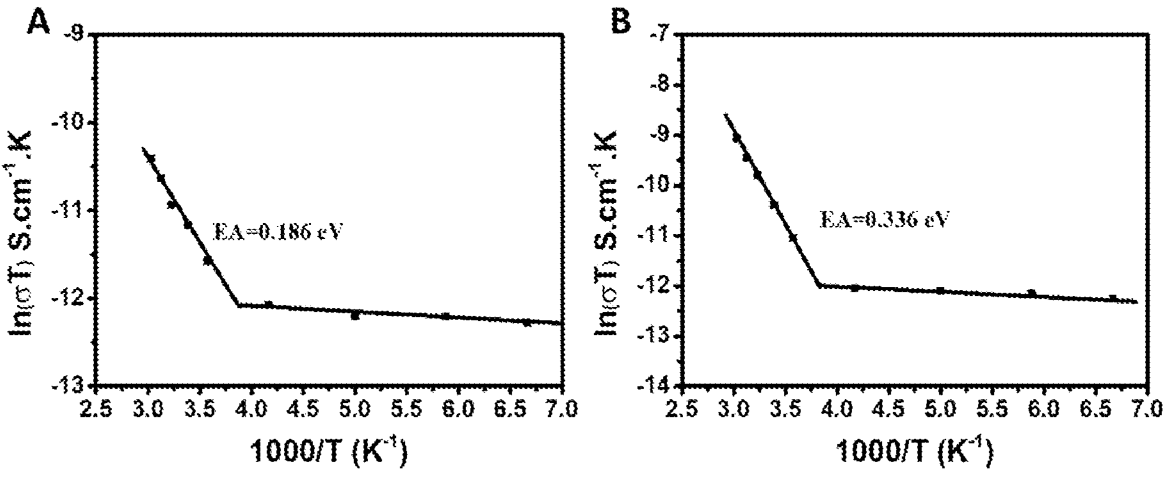

FIG. 22 shows temperature-dependent conductivity of WBG perovskite films (A) without and (B) with $TPABr_3$.

Figure 23:
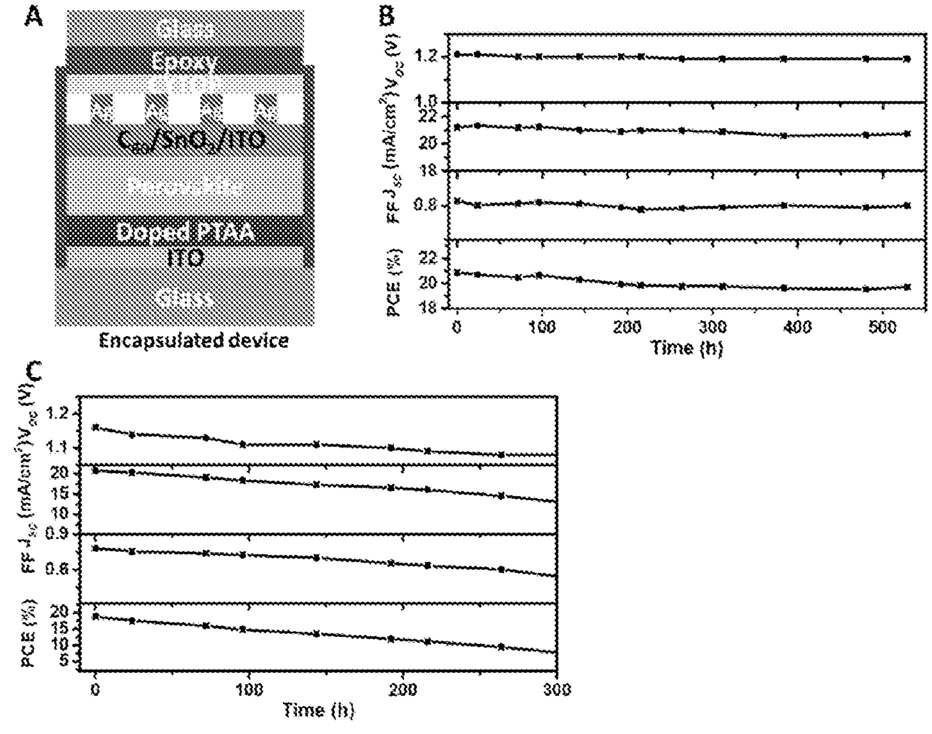

FIG. 23 shows long-term operational stability of encapsulated semitransparent cells. (A) Schematic of encapsulated semitransparent cells. Evolution of J-V parameters during long-term operational stability test under MPP load at 25° C. for $TPABr_3$ (B) and control (C) devices.

Figure 24:
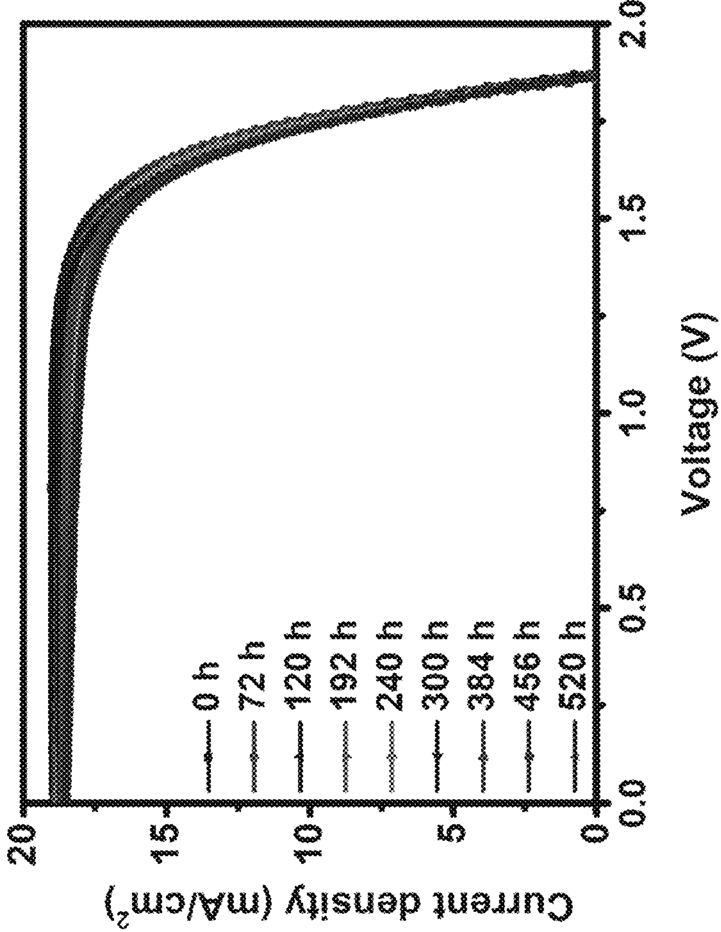

FIG. 24 shows a plot of the evolution of J-V curves of an encapsulated perovskite/silicon tandem device measured over 500-hour light stability test in ambient air.

DETAILED DESCRIPTION

Perovskite-silicon tandem cells with double side textured silicon can achieve higher efficiency with less optical loss. However, there are several challenges to obtaining such high efficiency. For one, wide bandgap (WBG) mixed halide perovskite materials are characterized as having a very short charge-carrier diffusion length. Additionally, a thick perovskite layer is typically needed to fully cover the textured silicon to avoid shunting. As shown herein, WBG perovskite materials with partial iodide sites replaced by bromide have increased deep charge trap concentrations induced by iodine interstitials, which limit the performance of WBG perovskite cells. However, as described herein, perovskite films prepared using an ink solution comprising an ammonium tribromide salt endows perovskite-silicon tandem solar cells containing the films with enhanced efficiency. In particular, the tribromide ions in the perovskite suppress iodine interstitial formation and therefore reduce charge recombination in bladed WBG perovskite solar cells.

Perovskite solar cells (PSCs) exhibited unprecedented progress in recent years with the highest certified efficiency reaching over 25% (1). To further improve the efficiency of PSCs and overcome the detailed balance theory limit for single-junction solar cells, tandem solar cells are generally applied by integrating wide-bandgap (WBG) perovskites with mature photovoltaic (PV) technologies, such as crystalline silicon, Cu (In, Ga) $Se_2$ (CIGS) (2-4) or with another low bandgap perovskites (5-7). Among these perovskite-based tandem PV technologies, the perovskite-silicon tandem solar cell has emerged as a mainstream PV technology that can deliver a certified efficiency over 29% (8). Currently, monolithic two-terminal perovskite-silicon tandem devices fabricated by solution processes are still predominately based on front-side polished and rear-side textured crystalline silicon (c-Si), which experience a large loss of photocurrent due to light reflection (9). Double-side textured crystalline silicon with increased light-trapping properties has been shown to deliver a high efficiency upper limit for perovskite/silicon tandem devices (10-12).

The first fully textured perovskite-silicon tandem cells had a front texture size of up to 6 micrometers (μm), in which the WBG perovskite on textured silicon was conformally formed by a combination of evaporation and solution coating (10). Recently, a much smaller texture structure of one micrometer or less on the front surface of silicon has been shown to have comparable anti-reflection capabilities as the large texture structure, enabling the fabrication of fully textured perovskite-silicon tandem devices using much simpler one-step solution-based blade-coating or spin coating methods (11, 12). However, the efficiencies of the reported perovskite-silicon tandem solar cells only reached 25-26%, which does not demonstrate the full potential of the double side textured silicon structure. The low PCEs of the tandem cells were predominately limited by the much smaller open-circuit voltage ($V_{OC}$) and fill factor (FF) than those made on flat silicon (11-14).

It is still difficult to deposit a perovskite layer to conformally cover textured silicon by solution-based methods, even when the texture size is as small as one micrometer. Thus, the deposited WBG perovskite layer still needs to be thick enough (>1 μm) to avoid shunting and afford both high efficiency and manufacturing viability. In this context, it is useful to deposit high-quality thick WBG perovskite films with long carrier diffusion length and low non-radiative recombination to enable efficient charge collection for efficient tandem devices on double-side-textured c-silicon. This imposes a greater requirement for WBG perovskite films made on textured silicon than those made on flat silicon. The WBG perovskite solar cell efficiency generally decreases quickly when the perovskite film thickness increases beyond 600 nm. In addition, mixed-halide I—Br perovskites, which are often used to obtain an optimum bandgap for tandem solar cells, typically fail to exhibit an expected $V_{OC}$ increase with bandgap broadening. Even for regular WBG perovskite devices fabricated on flat substrates, the $V_{OC}$ deficits are still much larger than those with optimized pure iodide perovskites (15). The $V_{OC}$ deficits of pure iodide perovskites has been reported to be as small as 0.3 V (16); however, the $V_{OC}$ is usually larger than 0.5 V in mixed halide WBG perovskite devices. Studies indicate that such a large $V_{OC}$ loss in WBG perovskites is caused by photo-induced halide segregation (17, 18). Mahesh et al. identified, however, that the dominant $V_{OC}$ loss mechanism in WBG perovskite cells is a result of relatively low radiative efficiency caused by higher defect density within WBG films, though these compositions might not show clear light induced phase segregation (19). No insight into the chemical nature of these defects was provided in Mahesh's investigation, however.

As described herein, it was identified that positive iodine interstitials ($I_i^+$) are the dominant, deep charge-trapping defects in WBG perovskites, and which increase with the incorporation of bromide. Further described is an effective way to reduce bulk deep trap density in WBG perovskite films by adding trimethylphenylammonium tribromide ($TPABr_3$), which dramatically elongates the carrier diffusion length. Mixed halide perovskite $Cs_{0.1}FA_{0.2}MA_{0.7}Pb(I_{0.85}Br_{0.15})_3$ with an ideal bandgap of 1.65 eV was used for fabricating monolithic tandem solar cells on textured silicon. Single-junction perovskite devices with over 1-μm-thick WBG perovskite films showed an increased PCE of 21.9% with an impressive $V_{OC}$ of 1.25 V and FF of 0.830. As shown herein, the perovskite ink formulation and solar cell fabrication strategy resulted in an efficiency of 28.6% for fully textured perovskite-silicon tandem cells.

The presently disclosed subject matter will now be described more fully hereinafter. However, many modifications and other embodiments of the presently disclosed subject matter set forth herein will come to mind to one skilled in the art to which the presently disclosed subject matter pertains having the benefit of the teachings presented in the foregoing descriptions. Therefore, it is to be understood that the presently disclosed subject matter is not to be limited to the specific embodiments disclosed and that modifications and other embodiments are intended to be included within the scope of the appended claims. In other words, the subject matter described herein covers all alternatives, modifications, and equivalents. Unless otherwise defined, all technical and scientific terms used herein have the same meaning as commonly understood by one of ordinary skill in this field. All publications, patent applications, patents, and other references mentioned herein are incorporated by reference in their entirety. In the event that one or more of the incorporated literature, patents, and similar materials differs from or contradicts this application, including but not limited to defined terms, term usage, described techniques, or the like, this application controls.

I. Definitions

As used herein, "and/or" refers to and encompasses any and all possible combinations of one or more of the associated listed items, as well as the lack of combinations when interpreted in the alternative ("or").

As used herein, the term "about," when referring to a measurable value such as an amount of a compound or agent of the current subject matter, dose, time, temperature, and the like, is meant to encompass variations of ±20%, ±10%, ±5%, ±1%, ±0.5%, or even ±0.10% of the specified amount.

As used herein, conditional language used herein, such as, among others, "can," "could," "might," "may," "e.g.," and the like, unless specifically stated otherwise or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

As used herein, "PSC" refers to perovskite solar cell.

As used herein, "PCE" refers to power conversion efficiency. The terms "power conversion efficiency," "PCE," "photovoltaic efficiency", and "solar cell efficiency," may be used interchangeably and refer to the ratio of energy output from the photovoltaic device to the energy input to the photovoltaic device. The energy output is in the form of electrical energy and energy input is in the form of electromagnetic radiation (e.g., sunlight). Unless otherwise indicated, the photovoltaic efficiency refers to terrestrial photovoltaic efficiency, corresponding to AM1.5 conditions, where AM is Air Mass. PCE may be measured by one or more techniques conventionally known to one of ordinary skill in the art.

As used herein, "photoactive device" refers to (i) a device capable of and configured to convert electromagnetic radiation (e.g., X-ray, infrared, ultraviolet, and/or visible light) to electrical energy and/or converting electrical energy to electromagnetic radiation. A photoactive device may be configured to both convert light to electrical energy (e.g., as a solar cell) and convert electrical energy to light (e.g., via electroluminescence), for example depending on the direction of electrical current in the device (e.g., depending on whether electrical power is withdrawn from or supplied to the device). Exemplary photoactive devices include, but are not limited to, a photovoltaic cell (also referred to as a solar cell), a photodiode, and a light emitting diode (LED). In certain embodiments, a photoactive device can also refer to a device configured to change its optical, physical, and/or electrical properties with change in its exposure to electromagnetic radiation and/or a device configured to change its optical properties in response to a change in input of electrical energy. Exemplary photoactive devices can also include, but are not limited to, a photoresistor, phototransistor, photomultiplier, photoelectric cell, and an electrochromic cell.

As used herein, "active layer" refers to a photoactive layer in a device, such as a solar cell, and/or it may include a photoactive material. Furthermore, it should be noted that the use of the term "active layer" is in no way meant to restrict or otherwise define, explicitly or implicitly, the properties of any other layer in the device.

As used herein, the term "defect" refers to a defective site in a crystal lattice where the local crystal structure does not correspond to the crystal structure of the bulk material. Non-limiting examples of defective sites include point defects, line defects, and planar defects. Point defects include vacancy defects (the absence of an ion), interstitial defects (the interstitial inclusion of an additional ion), Frenkel defects (a closely located pair of defects consisting of an interstitial defect and a vacancy defect) and the presence of an impurity ion. Planar defects include grain boundaries and stacking faults.

II. Perovskite Films

In one aspect, the subject matter described herein is directed to a perovskite film comprising:

(i) a composition of Formula I:

$$APbI_{3-z}Br_z \quad (I),$$

wherein,

A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), and guanidinium (GU), or a combination thereof; and z is between 0.01 and 1.0; and (ii) a tribromide salt.

In certain embodiments of the perovskite film, A may comprise an ammonium, an organic cation of the general formula $[NR_4]^+$ where the R groups can be the same or different groups. Suitable R groups include, but are not limited to: methyl, ethyl, propyl, butyl, pentyl group or isomer thereof; any alkane, alkene, or alkyne $C_xH_y$, where x=1-20, y=1-42, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., pyridine, pyrrole, pyrrolidine, piperidine, tetrahydroquinoline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (e.g., acetic acid, propanoic acid); and ester or amide derivatives thereof; any amino acid (e.g., glycine, cysteine, proline, glutamic acid, arginine, seine, histindine, 5-ammoniumvaleric acid) including alpha, beta, gamma, and greater derivatives; any silicon containing group (e.g., siloxane); and any alkoxy or group, $—OC_xH_y$, where x=0-20, y=1-42. In certain embodiments, A is methylammonium, ($CH_3NH_3^+$). In certain embodiments, A is methylammonium. In certain embodiments, A is tetramethylammonium, ($(CH_3)_4N^+$). In certain embodiments, A is butylammonium, which may be represented by ($CH_3(CH_2)_3NH_3^+$) for n-butylammonium, by ($(CH_3)_3CNH_3^+$) for t-butylammonium, or by ($(CH_3)_2CHCH_2NH_3$) for iso-butylammonium. In certain embodiments, A is phenethylammonium, which may be represented by $C_6H_5(CH_2)_2NH_3^+$ or by $C_6H_5CH(CH_3)NH_3$*. In certain embodiments, A comprises phenylammonium, $C_6H_5NH_3^+$.

In certain embodiments of the perovskite film, A may comprise a formamidinium, an organic cation of the general formula $[R_2NCHNR_2]^+$ where the R groups can be the same or different groups. Suitable R groups include, but are not limited to: hydrogen, methyl, ethyl, propyl, butyl, pentyl or an isomer thereof; any alkane, alkene, or alkyne $C_xH_y$, where x=1-20, y=1-42, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., imidazole, benzimidazole, dihydropyrimidine, (azolidinylidenemethyl)pyrrolidine, triazole); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof, any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, $—OC_xH_y$, where x=0-20, y=1-42. In certain embodiments A is a formamidinium ion represented by ($H_2N{=}CH{—}NH_2^+$).

In certain embodiments of the perovskite film, A may comprise a guanidinium, an organic cation of the general formula $[(R_2N)_2C{=}NR_2]^+$ where the R groups can be the same or different groups. Suitable R groups include, but are not limited to: hydrogen, methyl, ethyl, propyl, butyl, pentyl group or isomer thereof, any alkane, alkene, or alkyne $C_xH_y$, where x=1-20, y=1-42, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., octahydropyrimido[1,2-a]pyrimidine, pyrimido[1,2-a]pyrimidine, hexahydroimidazo[1,2-a]imidazole, hexahydropyrimidin-2-imine); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, $—OC_xH_y$, where x=0-20, y=1-42. In certain embodiments, A is a guanidinium ion of the type ($H_2N{=}C{—}(NH_2)_2^+$).

In certain embodiments of the perovskite film, A may comprise an alkali metal cation, such as $Li^+$, $Na^+$, $K^+$, $Rb^+$, or $Cs^+$.

"Pb" in the composition of Formula I of the perovskite film, refers to lead.

"I" refers to iodide and "Br" to bromide.

In certain embodiments of the perovskite film, z is between 0.05 and 1.0. In certain embodiments of the perovskite film, z is 0.01, 0.02, 0.03, 0.04, 0.05, 0.10, 0.15, 0.20, 0.25, 0.30, 0.35, 0.40, 0.41, 0.42, 0.43, 0.44, 0.45, 0.46, 0.47, 0.48, 0.49, 0.50, 0.55, 0.60, 0.65, 0.70, 0.75, 0.80, 0.85, 0.90, 0.95, or 1. In certain embodiments of the perovskite film, z is between 0.01 and 0.05, 0.01 and 0.03, 0.01 and 0.15, 0.02 and 0.10, 0.01 and 0.5, 0.01 and 0.75, 0.3 and 0.6, 0.2 and 0.7, 0.1 and 0.8, 0.3 and 0.5, 0.4 and 0.9, or 0.4 and 0.6.

In certain embodiments of the perovskite film, the tribromide salt is present in the perovskite film at a molar ratio of about 0.05 to about 1.0% relative to the composition of Formula I. In certain embodiments of the perovskite film, the tribromide salt is present in the perovskite film at a molar ratio of about 0.1 to about 0.5%, 0.05 to about 3%, about 0.05 to 2%, about 0.10 to about 0.8%, about 0.3 to about 0.7%, about 0.5 to about 0.9%, or about 0.4 to about 0.8% relative to the composition of Formula I. the tribromide salt is present in the perovskite film at a molar ratio of about 0.05%, 0.1%, 0.11, 0.12, 0.13, 0.14, 0.15, 0.16, 0.17, 0.18, 0.19, 0.2, 0.21, 0.22, 0.23, 0.24, 0.25, 0.26, 0.27, 0.28, 0.29, 0.3, 0.4, 0.5, 0.6, 0.7, 0.8, 0.9, 1.0, 1.1, 1.2, 1.3, 1.4, 1.5, 1.6, 1.7, 1.8, 1.9, or 2% relative to the composition of Formula I.

In certain embodiments of the perovskite film, the tribromide salt is selected from the group consisting of tetrabutylammonium tribromide, tetramethylammonium tribromide, trimethylphenylammonium tribromide, hexamethylenetetramine tribromide, pyridinium tribromide, 4-(dimethylamino)pyridinium tribromide, boron tribromide, phosphorus tribromide, aluminum tribromide, and benzyltrimethylammonium tribromide. In certain embodiments of the perovskite film, the tribromide salt is an ammonium tribromide salt. In certain embodiments of the perovskite film, the ammonium tribromide salt is trimethylphenylammonium tribromide.

In certain embodiments of the perovskite film, A is selected from the group consisting of Cs, FA, and MA, or a combination thereof; and z is between 0.3 and 0.6. In certain other embodiments of the perovskite film, A is Cs, FA, and MA, wherein the molar ratio of Cs to FA to MA is about 0.1:0.2:0.7; and z is 0.45.

In certain embodiments of the perovskite film, the composition of Formula I is $Cs_{0.1}FA_{0.2}MA_{0.7}PbI_{2.55}Br_{0.45}$; and the tribromide salt is trimethylphenylammonium tribromide, wherein the tribromide salt is present in the film at a molar ratio of about 0.2% relative to the composition of Formula I.

In certain embodiments of the perovskite film, the perovskite film has a thickness of about 300 nm to about 2000 nm. In certain embodiments, the perovskite film has a thickness of about 300 nm to about 1000 nm, about 300 nm to about 500 nm, about 400 nm to about 800 nm, about 500 nm to about 1500 nm, about 600 nm to about 1800 nm, about 300 nm to about 900 nm, about 1000 nm to about 1500 nm, about 1000 nm to about 2000 nm, about 400 nm to about 1100 nm, about 1200 nm to about 1500 nm, about 1300 nm to about 1800 nm, about 300 nm to about 400 nm, about 400 nm to about 500 nm, about 500 nm to about 600 nm, about 600 nm to about 700 nm, about 700 nm to about 800 nm, about 800 nm to about 900 nm, about 900 nm to about 1000 nm, about 1000 nm to about 1100 nm, about 1100 nm to about 1200 nm, about 1200 nm to about 1300 nm, about 1300 nm to about 1400 nm, about 1400 nm to about 1500 nm, about 1500 nm to about 1600 nm, about 1600 nm to about 1700 nm, about 1700 nm to about 1800 nm, about 1800 nm to about 1900 nm, or about 1900 nm to about 2000 nm.

III. Ink Solutions

In certain embodiments, the subject matter disclosed herein is directed to an ink solution, comprising:

(i) a composition of Formula I:

$$APbI_{3-z}Br_z \quad (I),$$

wherein,

A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), and guanidinium (GU), or a combination thereof, and z is between 0.01 and 1.0;

(ii) a tribromide salt;

and (iii) a solvent.

In certain embodiments of the ink solution, A may comprise an ammonium, an organic cation of the general formula $[NR_4]+$ where the R groups can be the same or different groups. Suitable R groups include, but are not limited to: methyl, ethyl, propyl, butyl, pentyl group or isomer thereof, any alkane, alkene, or alkyne $C_xH_y$, where x=1-20, y=1-42, cyclic, branched or straight-chain; alkyl halides, $C_xH_yX_z$, x=1-20, y=0-42, z=1- 42, X=F, Cl, Br, or I; any aromatic group (e.g., phenyl, alkylphenyl, alkoxyphenyl, pyridine, naphthalene); cyclic complexes where at least one nitrogen is contained within the ring (e.g., pyridine, pyrrole, pyrrolidine, piperidine, tetrahydroquinoline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (e.g., acetic acid, propanoic acid); and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, $—OC_xH_y$, where x=0-20, y=1-42. In certain embodiments, A is methylammonium, $(CH_3NH_3^+)$. In certain embodiments, A is methylammonium. In certain embodiments, A is tetramethylammonium, $((CH_3)_4N^+)$. In certain embodiments, A is butylammonium, which may be represented by $(CH_3(CH_2)_3NH_3^+)$ for n-butylammonium, by $((CH_3)_3CNH_3^+)$ for t-butylammonium, or by $(CH_3)_2CHCH_2NH_3^+)$ for iso-butylammonium. In certain embodiments, A is phenethylammonium, which may be represented by $C_6H_5(CH_2)_2NH_3^+$ or by $C_6H_5CH(CH_3)NH_3$*. In certain embodiments, A comprises phenylammonium, $C_6H_5NH_3^+$.

In certain embodiments of the ink solution, A may comprise a formamidinium, an organic cation of the general formula $[R_2NCHNR_2]^+$ where the R groups can be the same or different groups. Suitable R groups include, but are not limited to: hydrogen, methyl, ethyl, propyl, butyl, pentyl or an isomer thereof; any alkane, alkene, or alkyne $C_xH_y$, where x=1-20, y=1-42, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., imidazole, benzimidazole, dihydropyrimidine, (azolidinylidenemethyl)pyrrolidine, triazole); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, $—OC_xH_y$, where x=0-20, y=1-42. In certain embodiments A is a formamidinium ion represented by $(H_2N{=}CH—NH_2^+)$.

In certain embodiments of the ink solution, A may comprise a guanidinium, an organic cation of the general formula $[(R_2N)_2C{=}NR_2]^+$ where the R groups can be the same or different groups. Suitable R groups include, but are not limited to: hydrogen, methyl, ethyl, propyl, butyl, pentyl group or isomer thereof; any alkane, alkene, or alkyne $C_xH_y$, where x=1-20, y=1-42, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., octahydropyrimido[1,2-a]pyrimidine, pyrimido[1,2-a]pyrimidine, hexahydroimidazo[1,2-a]imidazole, hexahydropyrimidin-2-imine); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, $—OC_xH_y$, where x=0-20, y=1-42. In certain embodiments, A is a guanidinium ion of the type $(H_2N{=}C—(NH_2)_2^+)$.

In certain embodiments of the ink solution, A may comprise an alkali metal cation, such as $Li^+$, $Na^+$, $K^+$, $Rb^+$, or $Cs^+$. "Pb" in the composition of Formula I of the perovskite film, refers to lead.

"I" refers to iodide and "Br" to bromide.

In certain embodiments of the ink solution, z is between 0.05 and 1.0. In certain embodiments of the ink solution, z is 0.01, 0.02, 0.03, 0.04, 0.05, 0.10, 0.15, 0.20, 0.25, 0.30, 0.35, 0.40, 0.41, 0.42, 0.43, 0.44, 0.45, 0.46, 0.47, 0.48, 0.49, 0.50, 0.55, 0.60, 0.65, 0.70, 0.75, 0.80, 0.85, 0.90, 0.95, or 1. In certain embodiments of the ink solution, z is between 0.01 and 0.05, 0.01 and 0.03, 0.01 and 0.15, 0.02 and 0.10, 0.01 and 0.5, 0.01 and 0.75, 0.3 and 0.6, 0.2 and 0.7, 0.1 and 0.8, 0.3 and 0.5, 0.4 and 0.9, or 0.4 and 0.6.

In certain embodiments of the ink solution, the tribromide salt is present in the ink solution at a molar ratio of about 0.05 to about 1.0% relative to the composition of Formula I. In certain embodiments of the ink solution, the tribromide salt is present in the ink solution at a molar ratio of about 0.1 to about 0.5%, 0.05 to about 3%, about 0.05 to 2%, about 0.10 to about 0.8%, about 0.3 to about 0.7%, about 0.5 to about 0.9%, or about 0.4 to about 0.8% relative to the composition of Formula I. the tribromide salt is present in the ink solution at a molar ratio of about 0.05%, 0.1%, 0.11, 0.12, 0.13, 0.14, 0.15, 0.16, 0.17, 0.18, 0.19, 0.2, 0.21, 0.22, 0.23, 0.24, 0.25, 0.26, 0.27, 0.28, 0.29, 0.3, 0.4, 0.5, 0.6, 0.7, 0.8, 0.9, 1.0, 1.1, 1.2, 1.3, 1.4, 1.5, 1.6, 1.7, 1.8, 1.9, or 2% relative to the composition of Formula I.

In certain embodiments of the ink solution, the tribromide salt is selected from the group consisting of tetrabutylammonium tribromide, tetramethylammonium tribromide, trimethylphenylammonium tribromide, hexamethylenetetramine tribromide, pyridinium tribromide, 4-(dimethylamino)pyridinium tribromide, boron tribromide, phosphorus tribromide, aluminum tribromide, and benzyltrimethylammonium tribromide. In certain embodiments of the ink solution, the tribromide salt is an ammonium tribromide salt. In certain embodiments of the ink solution, the ammonium tribromide salt is trimethylphenylammonium tribromide.

In certain embodiments of the ink solution, A is selected from the group consisting of Cs, FA, and MA, or a combination thereof; and z is between 0.3 and 0.6. In certain other embodiments of the ink solution, A is Cs, FA, and MA, wherein the molar ratio of Cs to FA to MA is about 0.1:0.2:0.7; and z is 0.45.

In certain embodiments of the ink solution, the composition of Formula I is $Cs_{0.1}FA_{0.2}MA_{0.7}PbI_{2.55}Br_{0.45}$; and the tribromide salt is trimethylphenylammonium tribromide, wherein the tribromide salt is present in the ink solution at a molar ratio of about 0.2% relative to the composition of Formula I.

In certain embodiments of the ink solution, the solvent is selected from the group consisting of dimethyl sulfoxide, dimethylformamide, dichloromethane, tetrahydrofuran, γ-butyrolactone, 2-methoxyethanol, N,N'-Dimethylpropyleneurea, N-methyl-2-pyrrolidone, and acetonitrile, or a combination thereof. In certain embodiments, the solvent is selected from one or more of dimethyl sulfoxide, dimethylformamide, 2-methoxyethanol, acetonitrile, methanol, propanol, butanol, tetrahydrofuran, pyridine, alkylpyridine, pyrrolidine, chlorobenzene, dichlorobenzene, dichloromethane, 1-methoxypropan-2-ol, 2-methoxy-1-methylethyl acetate, 2-butoxyethanol, 2-butoxyethyl acetate, 2-(propyloxy)ethanol, ethyl 3-ethoxypropionate, glycol ethers, dimethylacetamide, acetone, N,N'-Dimethylpropyleneurea, and chloroform.

IV. Methods for Preparing Perovskite Films

In certain embodiments, the subject matter disclosed herein is directed to a method for preparing a perovskite film using the ink solutions disclosed herein, comprising:

- contacting an ink solution disclosed herein using a fast coating process onto a substrate to form a film, wherein the fast coating process is selected from the group consisting of blade coating, slot die coating, shear coating, gravure coating, brush coating, syringe coating, and screen printing.

In certain embodiments of the above method, the fast coating process is blade coating. In certain embodiments, a device is used in the fast coating process for contacting the ink solution onto the substrate. In the blade coating process, a "blade coater" may be used. As used herein, "blade coater" is synonymous with "doctor blade." In certain embodiments, doctor blade coating techniques are used to facilitate formation of the perovskite film during the fabrication process.

In certain embodiments of the above method, the perovskite film prepared has a thickness of about 300 nm to about 2000 nm. In certain embodiments, the perovskite film prepared has a thickness of about 300 nm to about 1000 nm, about 300 nm to about 500 nm, about 400 nm to about 800 nm, about 500 nm to about 1500 nm, about 600 nm to about 1800 nm, about 300 nm to about 900 nm, about 1000 nm to about 1500 nm, about 1000 nm to about 2000 nm, about 400 nm to about 1100 nm, about 1200 nm to about 1500 nm, about 1300 nm to about 1800 nm, about 300 nm to about 400 nm, about 400 nm to about 500 nm, about 500 nm to about 600 nm, about 600 nm to about 700 nm, about 700 nm to about 800 nm, about 800 nm to about 900 nm, about 900 nm to about 1000 nm, about 1000 nm to about 1100 nm, about 1100 nm to about 1200 nm, about 1200 nm to about 1300 nm, about 1300 nm to about 1400 nm, about 1400 nm to about 1500 nm, about 1500 nm to about 1600 nm, about 1600 nm to about 1700 nm, about 1700 nm to about 1800 nm, about 1800 nm to about 1900 nm, or about 1900 nm to about 2000 nm.

V. Devices

The perovskite films described herein are useful in a variety of photoactive and photovoltaic applications. The perovskite films can be integrated into, for example, photoluminescent devices, photoelectrochemical devices, thermoelectric devices, and photocatalytic devices. Some non-limiting examples in which the polycrystalline perovskite films can be applied include solar cells, solar panels, solar modules, light-emitting diodes, lasers, photodetectors, x-ray detectors, batteries, hybrid PV batteries, field effect transistors, memristors, or synapses. In a preferred embodiment, the perovskite films described herein are useful in a wide band gap perovskite solar cell.

In certain embodiments, the subject matter disclosed herein is directed to a solar cell, comprising:

- one or more transparent conductive oxide layers;
- one or more conductive electrode layers; and
- one or more active layers, wherein at least one of said one or more active layers is a wide band gap material comprising a perovskite film described herein.

In certain embodiments of the above solar cell, the solar cell further comprises:

- one or more hole transport layers; and
- one or more electron transport layers.

In certain embodiments of the above solar cell, the solar cell comprises

- one transparent conductive oxide layer;
- one conductive electrode layer;
- one hole transport layer;
- one electron transport layer; and
- one active layer, wherein the active layer is a wide band gap material comprising a perovskite film described herein.

In certain embodiments of the above solar cell,

- the hole transport layer is disposed on the transparent conductive oxide layer;
- the active layer comprising the perovskite film is disposed on the hole transport layer;
- the electron transport layer is disposed on the active layer; and the conductive electrode layer is disposed on the electron transport layer.

In certain embodiments of the above solar cell, the electron transport layer is disposed on the transparent conductive oxide layer;

the active layer comprising the perovskite film is disposed on the electron transport layer;

the hole transport layer is disposed on the active layer; and the conductive electrode layer is disposed on the hole transport layer.

In certain embodiments of the above solar cell, the transparent conductive oxide layer is ITO;

the hole transport layer is PTAA optionally doped with TPFB;

the electron transport layer is $C_{60}$; and the conductive electrode layer is Cu or Ag; and wherein the solar cell further comprises a buffer layer of BCP or $SnO_2$ disposed between the electron transport layer and the conductive electrode layer.

In certain embodiments of the above solar cell, the perovskite film has a thickness of about 1000 nm. In certain other embodiments, the perovskite film has a thickness of about 300 nm, 400 nm, 500 nm, 600 nm, 700 nm, 800 nm, 900 nm, 1000 nm, 1100 nm, 1200 nm, 1300 nm, 1400 nm, 1500 nm, 1600 nm, 1700 nm, 1800 nm, 1900 nm, or 2000 nm. In certain other embodiments, the perovskite film has a thickness of about 300 to about 2000 nm, 300 nm to about 1000 nm, about 300 nm to about 500 nm, about 400 nm to about 800 nm, about 500 nm to about 1500 nm, about 600 nm to about 1800 nm, about 300 nm to about 900 nm, about 1000 nm to about 1500 nm, about 1000 nm to about 2000 nm, about 400 nm to about 1100 nm, about 1200 nm to about 1500 nm, about 1300 nm to about 1800 nm, about 300 nm to about 400 nm, about 400 nm to about 500 nm, about 500 nm to about 600 nm, about 600 nm to about 700 nm, about 700 nm to about 800 nm, about 800 nm to about 900 nm, about 900 nm to about 1000 nm, about 1000 nm to about 1100 nm, about 1100 nm to about 1200 nm, about 1200 nm to about 1300 nm, about 1300 nm to about 1400 nm, about 1400 nm to about 1500 nm, about 1500 nm to about 1600 nm, about 1600 nm to about 1700 nm, about 1700 nm to about 1800 nm, about 1800 nm to about 1900 nm, or about 1900 nm to about 2000 nm.

In certain embodiments of the above solar cell, the solar cell has a Power Conversion Efficiency (PCE) of at least 21%, 22%, 23%, 24%, or 25%.

In certain other embodiments, the subject matter described herein is directed to a tandem solar cell, comprising two active layers;

wherein a first sub cell comprises a first active layer, wherein the first active layer is the wide band gap material comprising the perovskite film disclosed herein; and a second sub cell comprises a second active layer, wherein the second active layer comprises silicon;

wherein the first sub cell is disposed on the second sub cell; and a recombination layer is disposed between the first sub cell and the second sub cell.

In certain embodiments of the above tandem solar cell, the silicon is textured silicon. In certain embodiments of the above tandem solar cell, the textured silicon is characterized by a truncated pyramid shape.

In certain embodiments of the above tandem solar cell, the perovskite film has a thickness of about 1000 nm. In certain other embodiments, the perovskite film has a thickness of about 300 nm, 400 nm, 500 nm, 600 nm, 700 nm, 800 nm, 900 nm, 1000 nm, 1100 nm, 1200 nm, 1300 nm, 1400 nm, 1500 nm, 1600 nm, 1700 nm, 1800 nm, 1900 nm, or 2000 nm. In certain other embodiments, the perovskite film has a thickness of about 300 to about 2000 nm, 300 nm to about 1000 nm, about 300 nm to about 500 nm, about 400 nm to about 800 nm, about 500 nm to about 1500 nm, about 600 nm to about 1800 nm, about 300 nm to about 900 nm, about 1000 nm to about 1500 nm, about 1000 nm to about 2000 nm, about 400 nm to about 1100 nm, about 1200 nm to about 1500 nm, about 1300 nm to about 1800 nm, about 300 nm to about 400 nm, about 400 nm to about 500 nm, about 500 nm to about 600 nm, about 600 nm to about 700 nm, about 700 nm to about 800 nm, about 800 nm to about 900 nm, about 900 nm to about 1000 nm, about 1000 nm to about 1100 nm, about 1100 nm to about 1200 nm, about 1200 nm to about 1300 nm, about 1300 nm to about 1400 nm, about 1400 nm to about 1500 nm, about 1500 nm to about 1600 nm, about 1600 nm to about 1700 nm, about 1700 nm to about 1800 nm, about 1800 nm to about 1900 nm, or about 1900 nm to about 2000 nm.

In certain embodiments of the above tandem solar cell, the tandem solar cell further comprises:

one or more electron transport layers;

one or more hole transport layers; and one or more interlayers layers.

In certain embodiments of the above tandem solar cell, a first hole transport layer is disposed on the recombination layer;

an interlayer is disposed on the first hole transport layer; and the perovskite film is disposed on the interlayer.

In certain embodiments of the above tandem solar cell, the interlayer is LiF or $MgF_2$.

In certain embodiments of the above tandem solar cell, the second sub cell is a silicon heterojunction cell.

In certain embodiments of the above tandem solar cell, the recombination layer comprises a conductive oxide material. In certain embodiments of the above tandem solar cell, the recombination layer comprises graphene oxide, gold, or mixtures thereof. In certain embodiments of the above tandem solar cell, the recombination layer comprises ITO.

In certain embodiments of the above tandem solar cell, the tandem solar cell has a Power Conversion Efficiency (PCE) of at least 26%, 27%, 28%, or 29%.

In certain embodiments of the above tandem solar cell, the tandem solar cell is capable of sustaining about 90%, 91%, 92%, 93%, 94%, or 95% of its initial efficiency after about 500 hours.

In certain embodiments of the above solar cell (tandem or single junction), the wide band gap material has a band gap of about 1.50 eV to about 2.4 eV. In certain other embodiments, the wide band gap material has a band gap of about 1.6 eV to 2.2 eV, 1.6 eV to 1.8 eV, 1.7 eV to 1.9 eV, or 1.8 eV to 2.1 eV. In certain other embodiments, the wide band gap material has a band gap of about 1.6 eV, 1.61 eV, 1.62 eV, 1.63 eV, 1.64 eV, 1.65 eV, 1.66 eV, 1.67 eV, 1.68 eV, 1.69 eV, or 1.7 eV.

The transparent conductive oxide layer and the conductive electrode layer comprise the anode and cathode (or vice versa) in the solar cell. In certain embodiments, the cathode and anode each comprise at least one of lithium, sodium, potassium, rubidium, cesium, francium, beryllium, magnesium, calcium, strontium, barium, radium, boron, aluminum, gallium, indium, thallium, tin, lead, flerovium, bismuth, antimony, tellurium, polonium, scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, indium, platinum, gold, mercury, rutherfordium, dubnium, seaborgium, bohrium, hassium, copernicium, samarium, neodymium, ytterbium, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, carbon nanowire, carbon nanosheet, carbon nanorod, carbon nanotube, graphite, indium tin oxide (ITO), fluorine-doped tin oxide (FTO), aluminum doped zinc oxide (AZO), antimony-tin mixed oxide (ATO), network of metal/alloy nanowire, or a combination of two or more of the above materials. In an embodiment, the positive electrode is a cathode. In an embodiment, the negative electrode is an anode. In an embodiment, the negative electrode is a terminal for connection to an external circuit. In an embodiment, the positive electrode is a terminal for connection to an external circuit.

In certain embodiments, the transparent conductive oxide layer is selected from the group consisting of ITO, FTO, ZITO, and AZO. In certain embodiments, the metal electrode is selected from the group consisting of Al, Au, Cu, Cr, Ca, Mg, Bi, Ag, and Ti.

In certain embodiments, the solar cell or module described herein contains two transparent conductive oxide layers, each independently selected from the group consisting of ITO, FTO, ZITO, and AZO.

In certain embodiments, the hole transport layer comprises at least one of poly(3,4-ethylene dioxithiophene) (PEDOT) doped with poly(styrene sulfon icacid) (PSS), Spiro-OMeTAD, pm-spiro-OMeTAD, po-spiro-OMeTAD, dopants in spiro-OMeTAD, 4,4'-biskptrichlorosilylpropylphenyl)pheny laminoThiphenyl (TPD-Si2), poly(3-hexyl-2,5-thienylene vinylene) (P3HTV), C60, carbon, carbon nanotube, graphene quantum dot, graphene oxide, copper phthalocyanine (CuPc), Polythiophene, poly(3,4-(1hydroxymethyl)ethylenedioxythiophene (PHMEDOT), n-dodecylbenzenesulfonic acid/hydrochloric acid doped poly(aniline) nanotubes (a-PANIN)s, poly(styrene sulfonic acid)-graft-poly(aniline) (PSSA-g-PANI), poly(9,9-dioctylfluorene)-co-N-(4-(1-methylpropyl)phenyl) diphenylamine (PFT), 4,4'-bis(p-trichlorosilylpropylphenyl) phenylaminobiphenyl (TSPP), 5,5'-bis(p-trichlorosilylpropylphenyl) phenylamino-2,20 bithiophene (TSPT), N-propyltriethoxysilane, 3,3,3-trifluo ropropyltrichlorosilane or 3-aminopropyltriethoxysilane, Poly(bis(4-phenyl)(2,4,6-trimethylphenyl)amine) (PTAA), (Poly[[(2,4-dimethylphenyl)imino]-1,4-phenylene(9,9-dioctyl-9H-fluorene-2,7-diyl)-1,4phenylene], (PF8-TAA)), (Poly [[(2,4-dimethylphenyl)imino]-1,4-phenylene (6,12-dihydro-6,6,12,12tetraoctylindeno[1,2-b]fluorene-2,8-diyl)-1,4-phenylene]) (PIF8-TAA), poly[[4,8-bis[(2-ethylhexyl)oxy]benzo[1,2-b:4,5-b]dithiophene-2,6-diyl][3-fluoro-2-[(2-ethylhexyl)carbonyl]thieno[3,4-b]thiophenediyl]](PTB7), poly[N-90-heptadecanyl-2,7-carbazole-alt-5,5-(40,70-di-2-thienyl-20,10,30-benzothiadiazole)](PCDTBT), Poly[2,5-bis(2-decyldodecyl)pyrrolo[3,4-c]pyrrole-1,4(2H,5H)-dione-(E)-1,2-di(2,20-bithiophen-5-yl) ethene](PDPPDBTE), 4,8-dithien-2-yl-benzo[1,2-d;4,5-d']bistriazole-alt-benzo[1,2-b:4,5b']dithiophenes (pBBTa-BDTs), pBBTa-BDT1, pBBTa-BDT2 polymers, poly(3-hexylthiophene) (P3HT), poly(4,4'-bis(N-carbazolyl)-1,1'-biphenyl) (PPN), triarylamine (TAA) and/or thiophene moieties, Paracyclophane, Triptycene, and Bimesitylene, Thiophene and Furan-based hole transport materials, Dendrimer-like and star-type hole transport materials, VO, VOX, MoC, WO, ReO, NiOx, AgOx, CuO, Cu2O, V2O5, CuI, CuS, CuInS2, colloidal quantum dots, lead sulphide (PbS), CuSCN, Cu2ZnSnS4, Au nanoparticles and their derivatives. Thiophene derivatives, Triptycene derivatives, Triazine derivatives, Porphyrin derivatives, Triphenylamine derivatives, Tetrathiafulvalene derivatives, Carbazole derivatives and Phthalocyanine derivatives. As used herein, when a material is referred to a "derivate" or as "derivatives," such as Triphenylamine derivatives, the material contains Triphenylamine in its backbone structure. In certain embodiments, the hole transport layer is selected from the group consisting of PTAA, Spiro-OMeTAD, PEDOT:PSS, NiO, $MoO_3$, $V_2O_5$, Poly-TPD, EH44, P3HT, and a combination thereof.

In certain embodiments, the electron transport layer comprises at least one of LiF, CsP, LiCoO, CsCO, TiOx, TiO, nanorods (NRs), ZnO, ZnO nanorods (NRs), ZnO nanoparticles (NPs), ZnO, Al—O, CaO, bathocuproine (BCP), copper phthalocyanine (CuPc), pentacene, pyronin B, pentadecafluorooctyl phenyl-C60-butyrate (F-PCBM), C60, C60/LiF, ZnO NRS/PCBM, ZnO/cross-linked fullerene derivative (C-PCBSD), single walled carbon nanotubes (SWCNT), poly(ethylene glycol) (PEG), poly(dimethylsi loxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr DBT15), fluorene alternating and random copolymer bearing cationic groups in the alkyl side chains (PFPNBr), poly (ethylene oxide) (PEO), and fullerene derivatives. In certain embodiments, the electron transport layer is selected from the group consisting of C60, BCP, $TiO_2$, $SnO_2$, PCBM, ICBA, ZnO, ZrAcac, LiF, TPBI, PFN, $Nb_2O_5$, and a combination thereof.

In any of the embodiments above, the solar cell can further comprise a buffer layer. In certain embodiments, the buffer layer is disposed between the electron transport layer and said conductive electrode layer In certain embodiments, the buffer layer is selected from the group consisting of PDI, PDINO, PFN, PFN-Br, $SnO_2$, ZnO, ZrAcac, $TiO_2$, BCP, LiF, PPDIN6, and TPBi. In certain embodiments, the buffer layer is BCP.

In certain embodiments, the back of the solar cell is encapsulated with a polymer. The polymer can be any polymer sheet sealed by encapsulant, or ethylene-vinyl acetate copolymer (EVA), polypropylene, polyolefin (POE), ethylene-propylene-diene monomer (EPDM), or cross-linkable encapsulants that can be laminated to the back of solar the cell.

In certain embodiments the conductive electrode layer has a thickness of about 1 nm to about 1000 μm, about 100 nm to about 500 nm, about 1 μm to about 500 μm, about 250 μm to about 1000 μm, or about 250 nm to about 250 μm. In certain embodiments, the conductive electrode has a thickness of about 10 nm, 50 nm, 100 nm, 150 nm, 200 nm, 300 nm, 400 nm, 500 nm, 550 nm, 1 μm, 10 μm, 20 μm, 30 μm, 40 μm, 50 μm, 60 μm, 70 μm, 80 μm, 100 μm, 150 μm, 200 μm, 250 μm, 300 μm, 350 μm, 400 μm, 450 μm, 500 μm, 550 μm, 600 μm, 700 μm, 800 μm, 900 μm, or 100 μm.

In certain embodiments, the transparent conductive oxide layer has a thickness of about 1 nm to about 1000 μm, about 100 nm to about 500 nm, about 1 μm to about 500 μm, about 250 μm to about 1000 μm, or about 250 nm to about 250 μm. In certain embodiments, the transparent conductive layer has a thickness of about 10 nm, 50 nm, 100 nm, 150 nm, 200 nm, 300 nm, 400 nm, 500 nm, 550 nm, 1 μm, 10 μm, 20 μm, 30

μm, 40 μm, 50 μm, 60 μm, 70 μm, 80 μm, 100 μm, 150 μm, 200 μm, 250 μm, 300 μm, 350 μm, 400 μm, 450 μm, 500 μm, 550 μm, 600 μm, 700 μm, 800 μm, 900 μm, or 100 μm.

In certain embodiments, the hole transport layer and electron transport layer each individually has a thickness of about 0.1 nm to about 10 μm, about 0.5 nm to about 100 nm, about 10 nm to about 500 nm, about 300 nm to about 700 nm, about 100 nm to about 1 μm, about 1 μm to about 10 μm, or about 800 nm to about 5 μm. In certain embodiments, the hole transport layer and electron transport layer each individually has a thickness of about 0.1 nm, 0.5 nm, 1.0 nm, 2.0 nm, 5.0 nm, 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1000 nm, 1 μm, 2 μm, 3 μm, 4 μm, 5 μm, 6 μm, 7 μm, 8 μm, 9 μm, or 10 μm.

VI. Methods for Improving the Efficiency of a Wide Band Gap Solar Cell

In certain embodiments, the subject matter disclosed herein is directed to a method of improving the efficiency of a wide band gap solar cell, comprising:

incorporating an enhanced perovskite film into a wide band gap solar cell;

wherein the enhanced perovskite film comprises:

(i) a composition of Formula I $$APbI_{3-z}Br_z \quad (I),$$

wherein,

A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), and guanidinium (GU), or a combination thereof; and z is between 0.01 and 1.0;

and (ii) a tribromide salt;

wherein the tribromide salt is present in the enhanced perovskite film at a molar ratio of about 0.05 to about 1.0% relative to the composition of Formula (I); and wherein the efficiency of the wide band gap solar cell is improved relative to a wide band gap solar cell comprising a perovskite film of Formula I that lacks the tribromide salt.

As used herein, "improving the efficiency of a wide band gap solar cell" refers to increasing the power conversion efficiency (PCE) of a solar cell (which, in certain embodiments, can be a tandem solar cell) through modifications in a perovskite film active layer, as discussed in the methods and compositions described herein. In certain embodiments, such as discussed in the Examples, the above method results in an improvement in a wide band gap solar cell's efficiency (PCE), by 0.1%, 0.2%, 0.3%, 0.4%, 0.5%, 0.6%, 0.7%, 0.8%, 0.9%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 55%, 60%, 65%, 70%, 75%, 80%, 85%, 90%, 95%, 96%, 97%, 98%, or 99% compared to a wide band gap solar cell comprising a perovskite film of Formula I that lacks the tribromide salt.

In certain embodiments of the above method, z is between 0.05 and 1.0. In certain embodiments of the above method, z is between 0.05 and 1.0. In certain embodiments of the above method, z is 0.01, 0.02, 0.03, 0.04, 0.05, 0.10, 0.15, 0.20, 0.25, 0.30, 0.35, 0.40, 0.41, 0.42, 0.43, 0.44, 0.45, 0.46, 0.47, 0.48, 0.49, 0.50, 0.55, 0.60, 0.65, 0.70, 0.75, 0.80, 0.85, 0.90, 0.95, or 1. In certain embodiments of the above method, z is between 0.01 and 0.05, 0.01 and 0.03, 0.01 and 0.15, 0.02 and 0.10, 0.01 and 0.5, 0.01 and 0.75, 0.3 and 0.6, 0.2 and 0.7, 0.1 and 0.8, 0.3 and 0.5, 0.4 and 0.9, or 0.4 and 0.6.

In certain embodiments of the above method, the tribromide salt is present in the enhanced perovskite film at a molar ratio of about 0.2% relative to the composition of Formula I.

The subject matter described herein is directed to the following embodiments:

1. An ink solution, comprising:

(i) a composition of Formula I:

$$APbI_{3-z}Br_z \quad (I),$$

wherein,

A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), and guanidinium (GU), or a combination thereof; and z is between 0.01 and 1.0;

(ii) a tribromide salt;

and (iii) a solvent.

1A. The ink solution of embodiment 1, wherein z is between 0.05 and 1.0.

2. The ink solution of embodiment 1, wherein the tribromide salt is present in the ink solution at a molar ratio of about 0.05 to about 1.0% relative to the composition of Formula I.

3. The ink solution of embodiment 2, wherein the tribromide salt is present in the ink solution at a molar ratio of about 0.1 to about 0.5% relative to the composition of Formula I.

4. The ink solution of embodiment 2 or 3, wherein the tribromide salt is present in the ink solution at a molar ratio of about 0.2% relative to the composition of Formula I.

5. The ink solution of embodiment 1, wherein the tribromide salt is selected from the group consisting of tetrabutylammonium tribromide, tetramethylammonium tribromide, trimethylphenylammonium tribromide, hexamethylenetetramine tribromide, pyridinium tribromide, 4-(dimethylamino)pyridinium tribromide, boron tribromide, phosphorus tribromide, aluminum tribromide, and benzyltrimethylammonium tribromide.

6. The ink solution of embodiment 1, wherein the tribromide salt is an ammonium tribromide salt.

6a. The ink solution of embodiment 6, wherein the ammonium tribromide salt is selected from the group consisting of tetrabutylammonium tribromide, tetramethylammonium tribromide, trimethylphenylammonium tribromide, and benzyltrimethylammonium tribromide.

7. The ink solution of embodiment 6 or 6a, wherein the ammonium tribromide salt is trimethylphenylammonium tribromide.

8. The ink solution of embodiment 1, wherein:
A is selected from the group consisting of Cs, FA, and MA, or a combination thereof; and
z is between 0.3 and 0.6.
9. The ink solution of embodiment 8, wherein:
A is Cs, FA, and MA, wherein the molar ratio of Cs to FA to MA is about 0.1:0.2:0.7; and
z is 0.45.
10. The ink solution of embodiment 1, wherein the solvent is selected from the group consisting of dimethyl sulfoxide, dimethylformamide, dichloromethane, tetrahydrofuran, γ-butyrolactone, 2-methoxyethanol, N,N'-Dimethylpropyleneurea, N-methyl-2-pyrrolidone, and acetonitrile, or a combination thereof.
11. The ink solution of embodiment 1, wherein:
the composition of Formula I is $Cs_{0.1}FA_{0.2}MA_{0.7}PbI_{2.55}Br_{0.45}$; and
the tribromide salt is trimethylphenylammonium tribromide, wherein the tribromide salt is present in the ink solution at a molar ratio of about 0.2% relative to the composition of Formula I.
12. A method for preparing a perovskite film using the ink solution of any one of embodiments 1-11, comprising:
contacting the ink solution of any one of embodiments 1-11 using a fast coating process onto a substrate to form a film, wherein the fast coating process is selected from the group consisting of blade coating, slot die coating, shear coating, gravure coating, brush coating, syringe coating, and screen printing.
13. The method of embodiment 12, wherein the fast coating process is blade coating.
14. The method of embodiment 12, wherein the perovskite film prepared has a thickness of about 300 nm to about 2000 nm.
15. A perovskite film comprising:
(i) a composition of Formula I:

$$APbI_{3-z}Br_z \quad (I),$$

wherein,
A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), and guanidinium (GU), or a combination thereof; and
z is between 0.01 and 1.0; and
(ii) a tribromide salt.
15A. The perovskite film of embodiment 15, wherein z is between 0.05 and 1.0.
16. The perovskite film of embodiment 15, wherein the tribromide salt is present in the perovskite film at a molar ratio of about 0.05 to about 1.0% relative to the composition of Formula I.
17. The perovskite film of embodiment 16, wherein the tribromide salt is present in the perovskite film at a molar ratio of about 0.1 to about 0.5% relative to the composition of Formula I.
18. The perovskite film of embodiment 16 or 17, wherein the tribromide salt is present in the perovskite film at a molar ratio of about 0.2% relative to the composition of Formula I.
19. The perovskite film of embodiment 15, wherein the tribromide salt is selected from the group consisting of tetrabutylammonium tribromide, tetramethylammonium tribromide, trimethylphenylammonium tribromide, hexamethylenetetramine tribromide, pyridinium tribromide, 4-(dimethylamino)pyridinium tribromide, boron tribromide, phosphorus tribromide, aluminum tribromide, and benzyltrimethylammonium tribromide.
20. The perovskite film of embodiment 15, wherein the tribromide salt is an ammonium tribromide salt.
20a. The perovskite film of embodiment 20, wherein the ammonium tribromide salt is selected from the group consisting of tetrabutylammonium tribromide, tetramethylammonium tribromide, trimethylphenylammonium tribromide, and benzyltrimethylammonium tribromide.
21. The perovskite film of embodiment 20 or 20a, wherein the ammonium tribromide salt is trimethylphenylammonium tribromide.
22. The perovskite film of embodiment 15, wherein:
A is selected from the group consisting of Cs, FA, and MA, or a combination thereof; and
z is between 0.3 and 0.6.
23. The perovskite film of embodiment 22, wherein:
A is Cs, FA, and MA, wherein the molar ratio of Cs to FA to MA is about 0.1:0.2:0.7; and
z is 0.45.
24. The perovskite film of embodiment 15, wherein:
the composition of Formula I is $Cs_{0.1}FA_{0.2}MA_{0.7}PbI_{2.55}Br_{0.45}$; and
the tribromide salt is trimethylphenylammonium tribromide, wherein the tribromide salt is present in the film at a molar ratio of about 0.2% relative to the composition of Formula I.
25. The perovskite film of any one of embodiments 15-24, wherein the film has a thickness of about 300 nm to about 2000 nm.
26. A wide band gap perovskite solar cell, comprising the perovskite film of any one of embodiments 15-25.
27. A solar cell comprising:
one or more transparent conductive oxide layers;
one or more conductive electrode layers; and
one or more active layers, wherein at least one of said one or more active layers is a wide band gap material comprising the perovskite film of any one of embodiments 15-25.
28. The solar cell of embodiment 27 further comprising:
one or more hole transport layers; and
one or more electron transport layers.
29. The solar cell of embodiment 28, comprising:
one transparent conductive oxide layer;
one conductive electrode layer;
one hole transport layer;
one electron transport layer; and
one active layer, wherein the active layer is a wide band gap material comprising the perovskite film of any one of embodiments 15-25.
30. The solar cell of embodiment 29, wherein:
the hole transport layer is disposed on the transparent conductive oxide layer;
the active layer comprising the perovskite film is disposed on the hole transport layer;
the electron transport layer is disposed on the active layer; and
the conductive electrode layer is disposed on the electron transport layer.
31. The solar cell of embodiment 29, wherein:
the electron transport layer is disposed on the transparent conductive oxide layer;
the active layer comprising the perovskite film is disposed on the electron transport layer;

the hole transport layer is disposed on the active layer; and the conductive electrode layer is disposed on the hole transport layer.

32. The solar cell of embodiment 30, wherein:

the transparent conductive oxide layer is ITO;

the hole transport layer is PTAA optionally doped with TPFB;

the electron transport layer is $C_{60}$; and the conductive electrode layer is Cu or Ag; and wherein the solar cell further comprises a buffer layer of BCP or $SnO_2$ disposed between the electron transport layer and the conductive electrode layer.

33. The solar cell of embodiment 32, wherein the perovskite film has a thickness of about 1000 nm.

34. The solar cell of embodiment 32 or 33, having a Power Conversion Efficiency of at least 21%.

35. The solar cell of embodiment 27, wherein said solar cell is a tandem solar cell, comprising two active layers;

wherein a first sub cell comprises a first active layer, wherein the first active layer is the wide band gap material comprising the perovskite film of any one of embodiments 15-25; and a second sub cell comprises a second active layer, wherein the second active layer comprises silicon;

wherein the first sub cell is disposed on the second sub cell; and a recombination layer is disposed between the first sub cell and the second sub cell.

36. The solar cell of embodiment 35, wherein the silicon is textured silicon.

37. The solar cell of embodiment 36, wherein the textured silicon is characterized by a truncated pyramid shape.

38. The solar cell of any one of embodiments 35-37, wherein the perovskite film has a thickness of about 1000 nm.

39. The solar cell of any one of embodiments 35-38, further comprising:

one or more electron transport layers;

one or more hole transport layers; and one or more interlayers.

40. The solar cell of embodiment 39, wherein:

a first hole transport layer is disposed on the recombination layer;

an interlayer is disposed on the first hole transport layer; and the perovskite film is disposed on the interlayer.

41. The solar cell of embodiment 40, wherein the interlayer is LiF or $MgF_2$.

42. The solar cell of any one of embodiments 35-41, wherein the second sub cell is a silicon heterojunction cell.

43. The solar cell of embodiment 35, wherein the recombination layer is ITO.

44. The solar cell of any one of embodiments 35-43, having a PCE of at least 26%.

45. The solar cell of any one of embodiments 35-43, having a PCE of at least 27%.

46. The solar cell of any one of embodiments 35-43, capable of sustaining about 90% of its initial efficiency after about 500 hours.

47. The solar cell of any one of embodiments 27-43, wherein the wide band gap material has a band gap of about 1.50 eV to about 2.4 eV.

48. The solar cell of embodiment 47, wherein the wide band gap material has a band gap of about 1.65 eV.

49. A method of improving the efficiency of a wide band gap solar cell, comprising:

incorporating an enhanced perovskite film into a wide band gap solar cell;

wherein the enhanced perovskite film comprises:

(i) a composition of Formula I $$APbI_{3-z}Br_z \quad (I),$$

wherein,

A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), and guanidinium (GU), or a combination thereof; and z is between 0.01 and 1.0;

and (ii) a tribromide salt;

wherein the tribromide salt is present in the enhanced perovskite film at a molar ratio of about 0.05 to about 1.0% relative to the composition of Formula (I); and wherein the efficiency of the wide band gap solar cell is improved relative to a wide band gap solar cell comprising a perovskite film of Formula I that lacks the tribromide salt.

49A. The method of embodiment 49, where z is between 0.05 and 1.0.

The following examples are offered by way of illustration and not by way of limitation.

EXAMPLES

Materials and Methods

Formamidinium iodide (FAI), Formamidinium bromide (FABr), Methylammonium iodide (MAI), methylammonium bromide (MABr), and n-octylammonium iodide were purchased from Greatcell Solar company. PTAA (number-averaged molecular mass, Mn=7,000-10,000), Lead iodide ($PbI_2$), lead bromide ($PbBr_2$), cesium iodide (CsI), BCP, dimethyl sulfoxide, 2-methoxyethanol (2-ME), and toluene were purchased from Sigma-Aldrich. Trimethylphenylammonium tribromide ($TPABr_3$) and 4-Isopropyl-4'-methyldiphenyliodonium Tetrakis(pentafluorophenyl)borate (TPFB) were purchased from TCI chemicals. $C_{60}$ was purchased from NANO-C company. Lithium fluoride (LiF) was purchased from Alfa Aesar. Copper and silver for thermal evaporation were obtained from Kurt J. Lesker company. Tetrakis(dimethylamino)tin(IV) was purchased from Strem Chemicals.

Perovskite Single-Junction Cells Fabrication

Patterned ITO-glass substrates were washed with isopropanol and acetone sequentially and then treated with UV/ozone for 15 min before use. The PTAA doped with 15 wt % TPFB dissolved in toluene with a concentration of 3 mg/mL was blade-coated on an ITO-glass substrate at 20 mm/s with a 200 μm coating gap at room temperature. For blade coating $Cs_{0.1}FA_{0.2}MA_{0.7}Pb(I_{0.85}Br_{0.15})_3$ films, 1.6 M of $Cs_{0.1}FA_{0.2}MA_{0.7}Pb(I_{0.85}Br_{0.15})_3$ precursor dissolved in 2-ME with methylammonium hypophosphite (0.15 wt %), 1-α-phosphatidylcholine (0.05 wt %), n-octylammonium iodide (0.1 wt %), phenylethylammonium chloride (0.05 wt %), $TPABr_3$ (0.1, 0.2, and 0.5 mol) and 25 mol % of DMSO (compared to Pb) was blade-coated on a PTAA-coated ITO substrate using $N_2$ knife (20 psi) with a coating speed of 20 mm/s and a coating gap of 200 μm. Then, the as-coated solid perovskite films were annealed at 120° C. in air for 4 min.

For opaque devices, 18 nm of $C_{60}$, 6 nm of BCP, and 80 nm of Cu were sequentially deposited by thermal evaporation. For semitransparent devices, the WBG perovskite films were thermally evaporated with 18 nm of $C_{60}$, followed by coating 15 nm of $SnO_2$ buffer layer by atomic layer deposition (ALD) using a Ultratech/Cambridge Nanotech Savannah S200 system under a base pressure of ~0.05 torr. During $SnO_2$ deposition, the substrate temperature was maintained at 85° C., and the Tetrakis(dimethylamino)tin(IV) (TDMASn) and water precursor temperatures were maintained at 60° C. and room temperature, respectively. To deposit a 15-nm-thick $SnO_2$ layer, the following processing sequence was used for 2000 cycles: dosing sequences t1, t2, t3 and t4, where t1 and t3 refer to the times of precursor and oxidant-dosing and t2 and t4 refer to the times for purging, were 0.02, 10, 0.1 and 10 s, respectively. Then, 60 nm of ITO was sputtered from a 4-inch ITO target with 100 W power in a Kurt J. Lesker PVD 75 Pro Line tool on top of the $SnO_2$. 500 nm of Ag fingers were thermally evaporated on top of the ITO. Finally, a PDMS layer with a negative silicon wafer's random pyramid texture (2-5 μm pyramid size) was used as the antireflective coating.

Silicon Cells Fabrication

The silicon heterojunction (SHJ) bottom cell was fabricated with an n-type, 170-μm-thick, double-side textured, monocrystalline czochralski silicon. The texturing process was completed in accordance with the procedures discussed in B. Chen et al., Joule 4, 850-864 (2020). Once the texturing process was complete, the wafers were cleaned in piranha, RCA-B, and buffered oxide etchant solutions prior to deposition of amorphous silicon (a-Si:H) layers. Intrinsic and p-type a-Si:H films (6 and 15 nm thick, respectively) were first deposited by plasma-enhanced chemical vapor deposition on the rear side of the wafer, and intrinsic and n-type a-Si:H films (6 and 8 nm thick, respectively) were then deposited on the front side. A 20-nm-thick ITO layer was sputtered from a 90/10 $In_2O_3/SnO_2$ target in an MRC 944 tool on the front side of the wafer through a shadow mask to define 10.5 mm×10.5 mm square cells. A 70-nm-thick ITO layer was also sputtered on the textured rear surface through the same shadow mask, followed by a 300-nm-thick silica layer spray coated through a stainless-steel mesh to define local contact openings, and finally, a 200-nm-thick sputtered silver layer. The silicon cells were then annealed at 200° C. for 20 min before fabricating the perovskite cells on top.

Perovskite/Silicon Tandem Cells Fabrication

The blade coating parameter of the doped PTAA on textured silicon was the same as that on the glass substrate, except a higher doped PTAA concentration was used (4 mg/mL). The WBG perovskite layer, top interface layer, and electrode were identical to the semitransparent device fabrication.

Device Characterization

The J-V characteristics of solar cells were recorded using a Keithley 2400 source meter with a Xenon lamp-based solar simulator (Oriel Sol3A, Class AAA Solar Simulator). The intensity of simulated light was calibrated to 100 mW $cm^{-2}$ by a silicon reference cell (Newport 91150 V-KG5). All devices were measured with a scan rate of 0.1 V/s in air at room temperature, and the delay time was 10 ms. For single-junction perovskite devices, the working area was defined by a photomask with an aperture area of 6.08 $mm^2$. For tandem devices, the working area was defined by a photomask with an aperture area of 1 $cm^2$.

PL, TRPL, and PL Mapping

The PL and TRPL spectra were measured by a PicoQuant Flue Time 300 instrument at room temperature. The excitation source was a 640 nm pulsed laser with a repetition frequency of 5 MHz. The PL mapping was conducted on a PicoQuant MT100 FLIM System at room temperature. A 640 nm laser pulsed at 2 MHz with an intensity of 0.7 sun per pulse was coupled into the confocal microscope and focused 20×20 μm onto the sample. The PL mapping was conducted over a region, and the PL intensity was recorded by a hybrid PMT detector.

Long-Term Operational Stability Test

Single-junction and tandem devices were encapsulated with a coating of CYTOP thin layer first (followed by annealing at 60° C. for 20 min), and then deposited with epoxy to create a seal over the active area covered with a glass. Encapsulated solar cells were kept in ambient environment and continuously illuminated under a xenon-lamp-based solar simulator (SF300A, Sciencetech) with 1-sun light intensity. During stability tests, the encapsulated devices under resistive load (determined from maximum power point) were coupled to a cooling stage maintained at 25° C.

Ion Migration Measurements

Activation energy for ion migration can be extracted from the temperature-dependent electrical conductivity by the Nernst-Einstein relation: $\sigma(T)=(\sigma_0/T)\exp(-E_a/KT)$, where k is the Boltzmann constant, Go is a constant, and T is temperature.

Activation energy measurements were performed in a probe station under vacuum below 10 Pa with white light through a quartz window. The samples were placed on a metal plate with its temperature being controlled by a heater and injected with liquid $N_2$. For conductivity, the current through the devices was stabilized for 5 min when an objective temperature was reached, before the current measurement was performed. A semiconductor analyzer (Keithley 2400) was used for current measurements with an applied bias of 10 V Time-Resolved Microwave Conductivity (TRMC) Measurements WBG perovskite films were deposited by blade coating on 25×11×1.1 mm quartz plates identical to device films, and excited with 650 nm laser excitation at 10 Hz over a fluence range of 2 orders of magnitude to verify the data was collected in an intensity-independent regime of photoresponse kinetics. Samples were sealed within the microwave cavity and flushed continuously with dry $N_2$ during all measurements. The relative change in microwave power, P, was recorded. This change in microwave power, P, results from the absorption of microwaves by photoinduced free electrons and holes in the sample, and is related to photoconductivity through the following equation: $\Delta P/P=-K\Delta G$, where the calibration factor K is experimentally determined individually for each sample. Considering holes and electrons are created in equal pairs, the quantum generation efficiency multiplied by the sum of carrier mobilities is related to photoconductivity through:

$$\Delta G = \beta q F_A I_0 (\varphi \sum \mu),$$

where q is the elementary charge, β=2.2 is the geometric factor for the X-band waveguide used, $I_0$ is the incident photon flux, FA the fraction of light absorbed at the excitation wavelength, f is the quantum efficiency of free carrier generation per photon absorbed and Pm the sum of the mobilities of electrons and holes. Bi-exponential fits of the photoconductivity decay transients were weighted to calculate the average carrier lifetime using the equation: $\tau_{avg}=(A_0\tau_0+A_1\tau_1)/(A_0+A_1)$.

External Quantum Efficiency (EQE) Measurements

Perovskite solar cells: EQE measurements were conducted with a Newport quantum efficiency measurement kit by focusing a monochromatic light beam with a wavelength from 300 to 900 nm onto the device.

Tandem solar cells: EQE measurements were performed via a PV Measurements QE-X10 tool. Bias lighting of a white light equipped with a long pass (>800 nm) filter and green light were applied to measure the EQE of the perovskite and silicon sub cells, respectively.

DFT Calculations

DFT calculations were performed using the CASTEP package. Perdew-Burke-Ernzerhof (PBE) correlation exchange functional at the generalized gradient approximation (GGA) level and ultrasoft pseudopotentials with a plane wave basis set energy cut-off of 500 eV were adopted. The geometric optimization of each periodic cell was carried out until the change in energy and force in each atom were less than 1×10-5 eV/atom and 0.03 eV/Å, respectively. The formation energy of an interstitial iodide was calculated by E_f=(defect)−E(perf)−μ_I+qE_F, where E(defect) and E(perf) were the total energy of the perovskite crystal with and without an interstitial iodide, μI was the chemical potential of I which was chosen to be ½ of the energy of an iodine molecule, q was the charge state of the interstitial iodide which was 1 and EF was the Fermi level of the perovskite.

Figure 1:
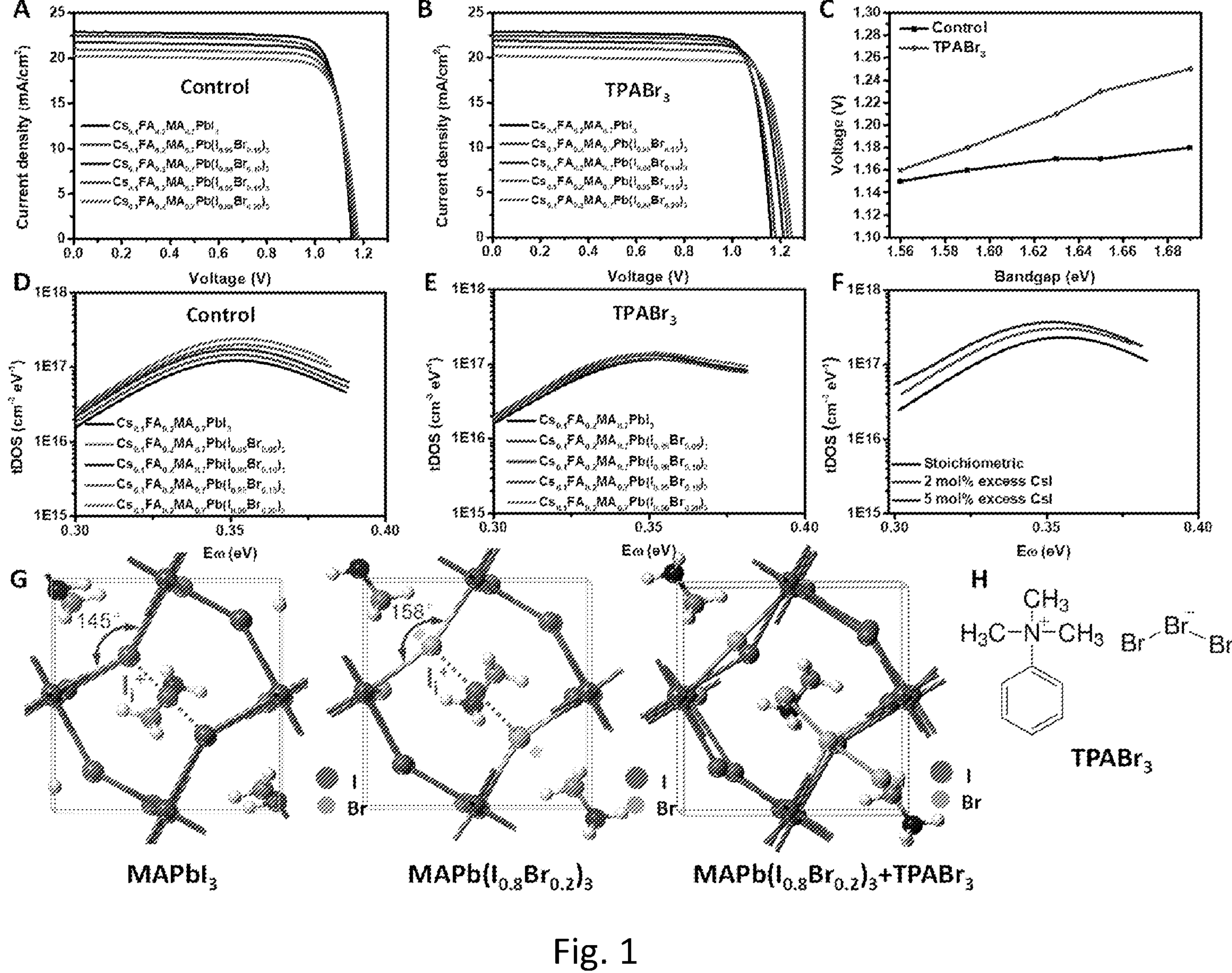
FIG. 1 shows how Br content affects trap density distributions in $Cs_{0.1}FA_{0.2}MA_{0.7}Pb(I_{1-x}Br_x)_3$ solar cells. (A) and (B) J-V characteristics of $Cs_{0.1}FA_{0.2}MA_{0.7}Pb(I_{1-x}Br_x)_3$ solar cells (x=0, 5%, 10%, 15%, and 20%) without and with $TPABr_3$. (C) $V_{OC}$ of control and $TPABr_3$ devices as a function of bandgap. (D) and (E) tDOS spectra of $Cs_{0.1}FA_{0.2}MA_{0.7}Pb(I_{1-x}Br_x)_3$ (x=0, 5%, 10%, 15%, and 20%) solar cells without and with $TPABr_3$. (F) tDOS spectra of $Cs_{0.1}FA_{0.2}MA_{0.7}Pb(I_{0.85}Br_{0.15})_3$ solar cells with and without excess CsI. (G) Geometrical structures of $MAPbI_3$ and $MAPb(I_{0.85}Br_{0.2})_3$ with iodine interstitial. Calculated geometrical structure of $MAPb(I_{0.8}Br_{0.2})_3$ with $Br_3^-$. (H) Chemical structure of $TPABr_3$.
Figure 2:
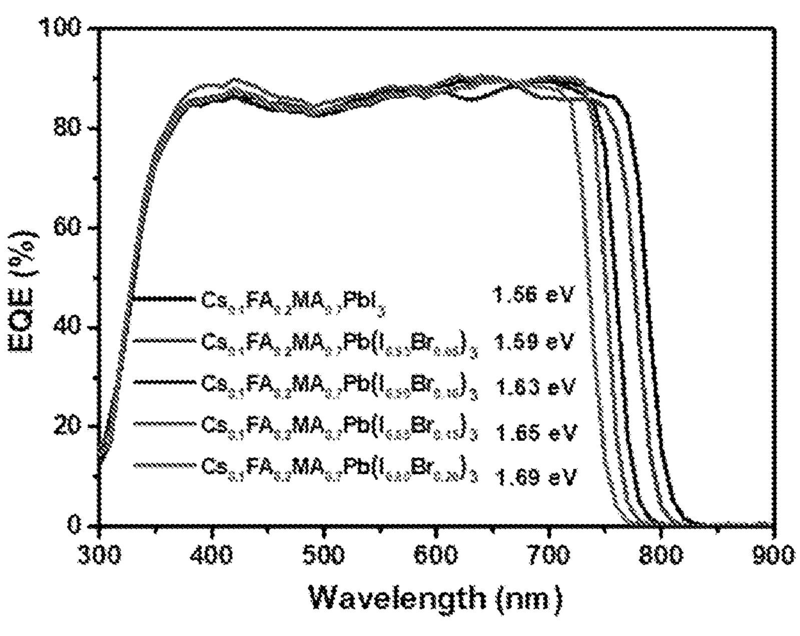
FIG. 2 shows a plot of external quantum efficiency percent versus wavelength for $Cs_{0.1}FA_{0.2}MA_{0.7}Pb(I_{1-x}Br_x)_3$ solar cells (x=0, 5%, 10%, 15%, and 20%).
Figure 3:
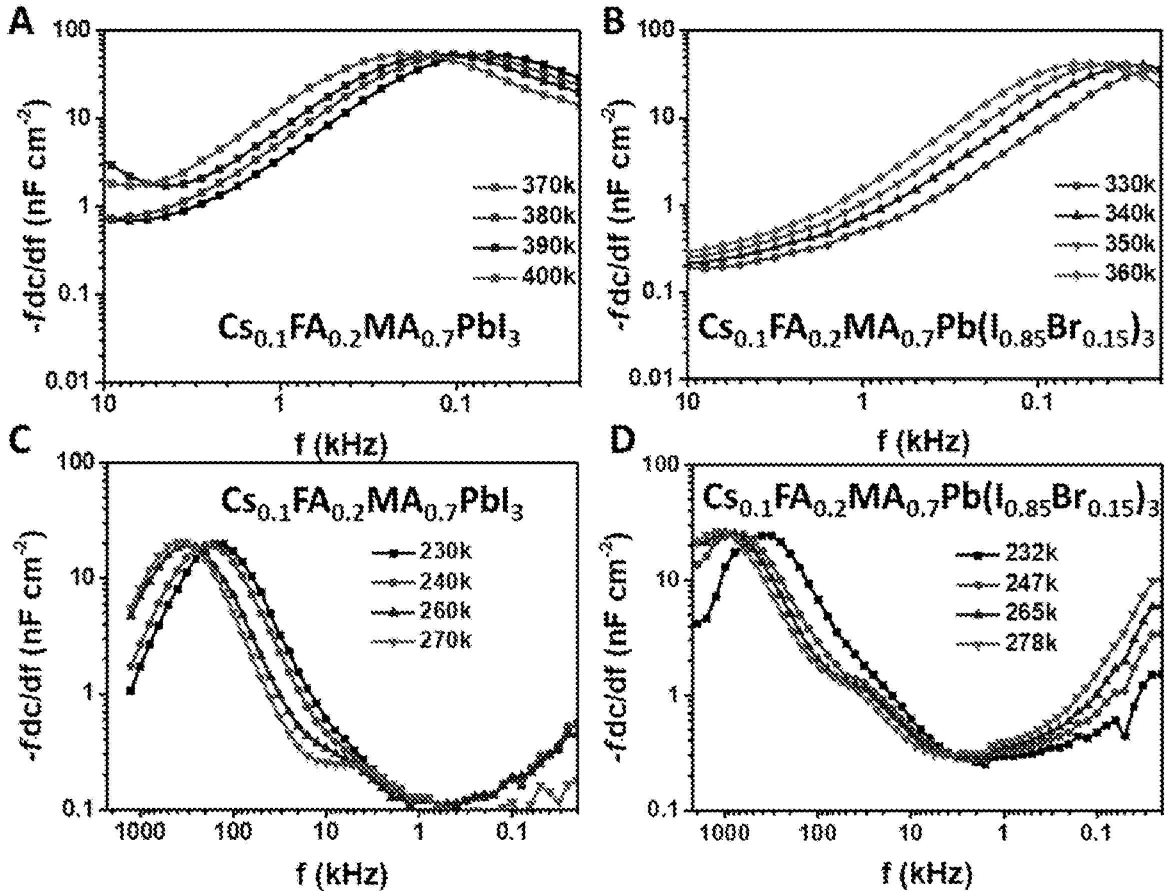
FIG. 3 shows differentiated capacitance spectra of $Cs_{0.1}FA_{0.2}MA_{0.7}PbI_3$ (A and C) and $Cs_{0.1}FA_{0.2}MA_{0.7}Pb(I_{0.85}Br_{0.15})_3$ (B and D) measured under different temperatures.
Figure 4:
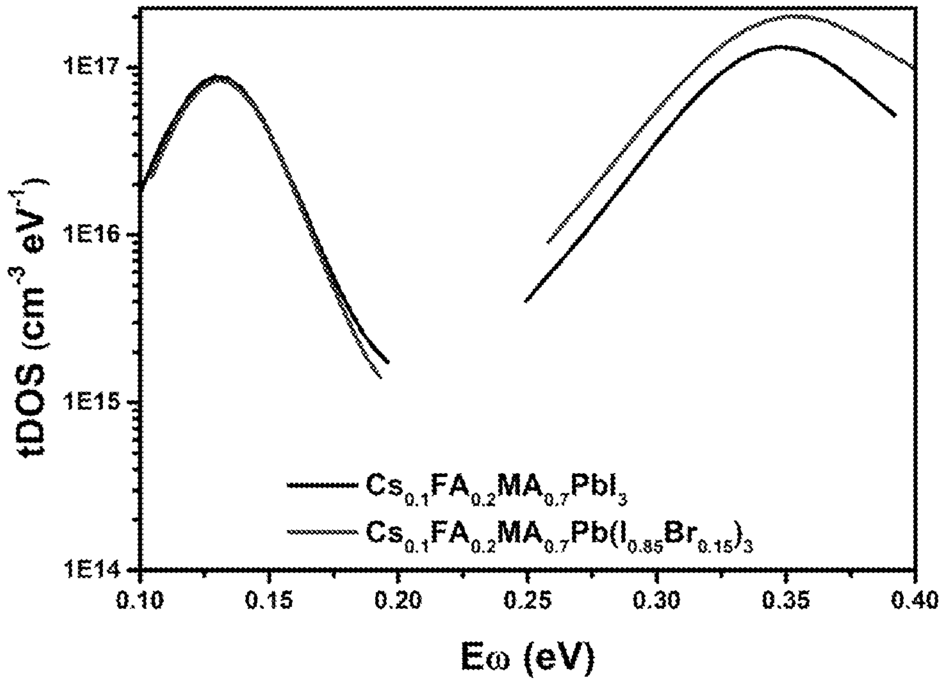
FIG. 4 shows tDOS spectra of $CsFAMAPbI_3$ and $CsFAMAPb(I_{0.85}Br_{0.15})_3$ determined from temperature dependent capacitance-frequency measurements.

Example 1: Trap Distribution in WBG Perovskite Solar Cells $Cs_{0.1}FA_{0.2}MA_{0.7}Pb(I_{1-x}Br_x)_3$ (x=0, 5%, 10%, 15%, 20%) perovskite devices with various amounts of bromide content were fabricated by air knife-assisted blade-coating (11, 20). All other conditions were kept unchanged to determine the influence of bromide incorporation on defect properties in WBG perovskites. The bromide ratio was intentionally controlled to be or below 20% to avoid the notable light induced phase segregation in WBG perovskites (17). The typical J-V curves of p-i-n structure $Cs_{0.1}FA_{0.2}MA_{0.7}Pb(I_{1-x}Br_x)_3$ devices are shown in FIG. 1 (inset A). To quantify the $V_{OC}$ penalty from bromide addition, the $V_{OC}$ as a function of optical bandgap of perovskites determined from EQE spectra (FIG. 2) is depicted in FIG. 1 (inset C). $V_{OC}$ deficits clearly increased with the addition of more Br to $Cs_{0.1}FA_{0.2}MA_{0.7}Pb(I_{1-x}Br_x)_3$. To verify whether the larger $V_{OC}$ deficit is caused by the generation of additional defects, the trap density of states (tDOS) was measured in $Cs_{0.1}FA_{0.2}MA_{0.7}Pb(I_{1-x}Br_x)_3$ devices using thermal admittance spectroscopy to determine the energetic distribution of defects. Here, the depth of the traps was determined by measuring tDOS under different temperatures (FIG. 3). As shown in FIG. 4, both the $Cs_{0.1}FA_{0.2}MA_{0.7}PbI_3$ and $Cs_{0.1}FA_{0.2}MA_{0.7}Pb(I_{0.85}Br_{0.15})_3$ devices exhibit two similar trap bands with one centered at ~0.12 eV, and the other centered at ~0.35 eV, indicating thar Br addition did not introduce new types of charge traps. With an increase of Br percentage from 0 to 20%, tDOS in deep trap region (0.3-0.4 eV) increased, which is consistent with previous observations of reduced radiative recombination efficiency from perovskites with more bromide (FIG. 1 (inset D))(21).

Figure 5:
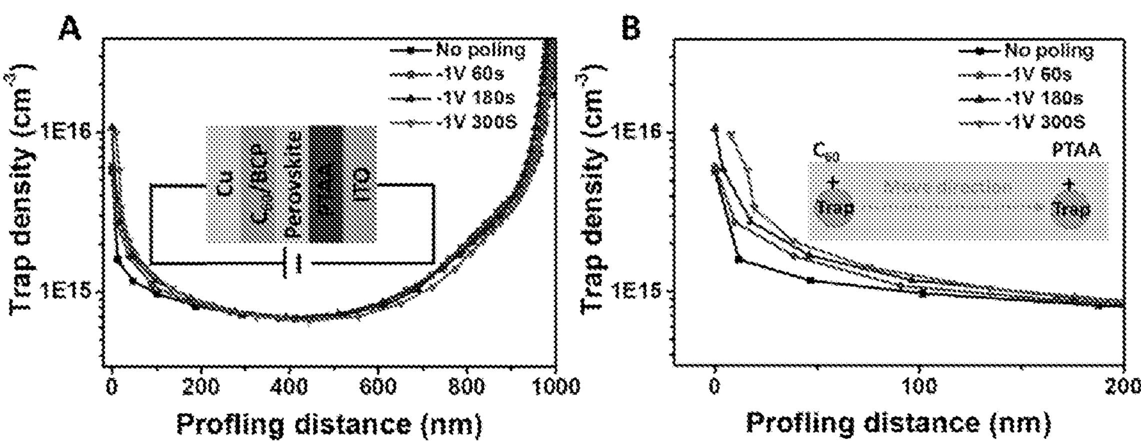
FIG. 5 shows plots of the dependence of trap density on profiling distance of $Cs_{0.1}FA_{0.2}MA_{0.7}Pb(I_{0.85}Br_{0.15})_3$ under reverse bias (A). The trap moved from the C60/perovskite interface toward the PTAA/perovskite interface with long reverse bias duration, which suggests the measured deep trap is a positively charged defect (B). The trap density was acquired by subtracting the free carrier density at ac frequency (50 kHz) from the total carrier density measured at ac frequency (5 kH), which corresponds to a charge trap centered at 0.35 eV.

Previous studies on pure iodide perovskites elucidated that the two main deep trap bands are induced by negative halide interstitials ($I_i^-$) or positive halide interstitials ($I_i$*). To further verify whether these deep traps in $Cs_{0.1}FA_{0.2}MA_{0.7}Pb(I_{1-x}Br_x)_3$ are still iodine interstitial related defects, a small amount of CsI was added to $Cs_{0.1}FA_{0.2}MA_{0.7}Pb(I_{0.85}Br_{0.15})_3$ and the trap density change was measured. As shown in inset E of FIG. 1, the tDOS in $Cs_{0.1}FA_{0.2}MA_{0.7}Pb(I_{0.85}Br_{0.15})_3$ grown in I-rich environment (excess CsI) exhibited a higher deep trap density. This indicates that these deep charge traps are still iodine interstitials, considering the lower formation energy of interstitial iodine defects in I-rich conditions from previous calculations (22). To determine whether they are negative halide interstitials ($I_i^-$) or positive halide interstitials ($I_i^+$), a reverse bias was applied to the device and the deep trap distribution was tracked by variation using drive-level capacitance profiling (DLCP) measurements (23). As shown in FIG. 5, deep traps moved toward the PTAA side, indicating that these charge traps are positively charged. Accordingly, the measured deep charge trap was assigned $I_i^+$.

Figures 6, 7:
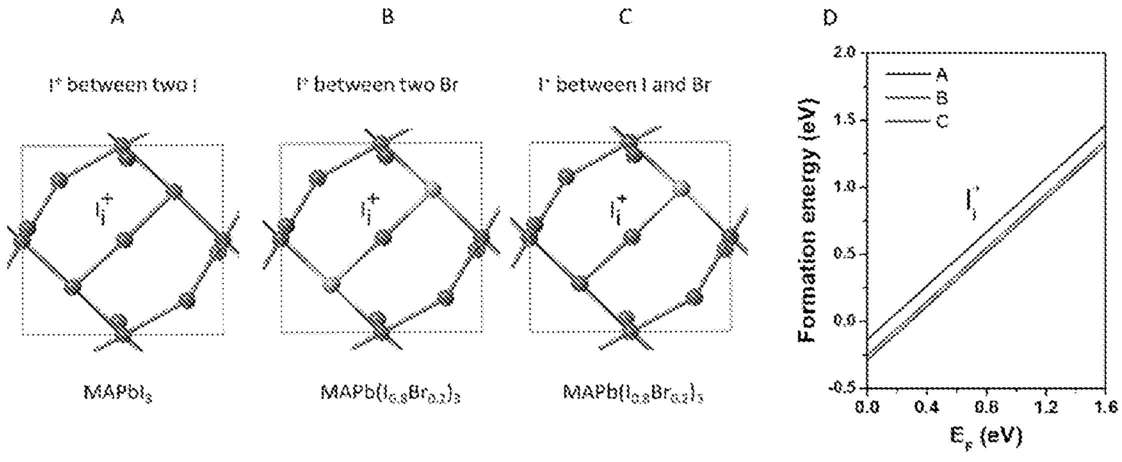
FIG. 6 shows structures and corresponding formation energy versus Fermi level plots of $I_i^+$ in $MAPbI_3$ (A) and $MAPb(I_{0.85}Br_{0.2})_3$ (B and C). For $MAPb(I_{0.85}Br_{0.2})_3$, the formation energy of $I_i^+$ in between two Br and in between I and Br were calculated (D).
FIG. 7 shows top-view SEM images of $Cs_{0.1}FA_{0.2}MA_{0.7}Pb(I_{0.85}Br_{0.15})_3$ films (A) without and (B) with $TPABr_3$.

Adding Br to the iodide perovskites increased the concentration of the $I_i^+$ defect band. A larger depth of $I_i^+$ can be explained by the slightly enlarged bandgap by Br incorporation. The increased $I_i^+$ density in WBG perovskites indicates a lower formation energy for these defects with Br incorporation. The Fermi level dependent formation energy of $I_i^+$ in $MAPbI_3$ and $MAPb(I_{0.85}Br_{0.2})_3$ was calculated, showing a lower formation energy of $I_i^+$ across the bandgap in $MAPb(I_{0.85}Br_{0.2})_3$ (FIG. 6). To show the underlying reason for the decreased formation energy of $I_i^+$ in $MAPb(I_{0.85}Br_{0.2})_3$, the calculated structures of $I_i^+$ in $MAPbI_3$ and $MAPb(I_{0.85}Br_{0.2})_3$ are provided in FIG. 1 (inset G). The smaller ionic radius of Br leads to an increase in the Pb—Br—Pb angle by 130 compared to that of Pb—I—Pb in $MAPbI_3$, resulting in an increased Br . . . Br (or Br . . . I) distance compared to the I . . . I distance, making it easier to form $I_i^+$ in between Br . . . Br or Br . . . I atoms. The calculated structure of I . . . I replaced with Br . . . Br is shown. The Br . . . I distance is also increased compared to I . . . I due to the increased bonding angle. $TPABr_3$ was added into the WBG perovskites to reduce $I_i^+$ concentration. The chemical structure for $TPABr_3$ is shown in inset H in FIG. 1. Here, the central Br bonded with two adjacent Br atoms from $TPABr_3$ can be located in the position of the octahedron and terminate the big organic cation ($TPA^+$) at the perovskite crystal surface. The $Br_3^-$ can occupy the halide-site or fill a halide vacancy in an equivalent way and leave two terminal Br atoms, thereby limiting the formation of iodine interstitials and reducing the $I_i^+$ concentration. To test this theory, 0.5 mol % (relative to lead ions in perovskites) of $TPABr_3$ was added to the precursor solution and used to fabricate single junction WBG perovskite devices. The $Cs_{0.1}FA_{0.2}MA_{0.7}Pb(I_{1-x}Br_x)_3$ devices showed lower tDOS at a deep energy depth after adding $TPABr_3$ (FIG. 1E). Typical J-V curves for $TPABr_3$—$Cs_{0.1}FA_{0.2}MA_{0.7}Pb(I_{1-x}Br_x)_3$ are shown in inset B in FIG. 1 and corresponding photovoltaic parameters are summarized in Table 1. $Cs_{0.1}FA_{0.2}MA_{0.7}Pb(I_{1-x}Br_x)_3$ devices showed decreased PCE with increasing Br concentration, correlating with declined current density. The $V_{OC}$ displays a clear saturation at high Br concentration, which is consistent with the measured higher tDOS at the deep level region (inset C in FIG. 1). With the addition of $TPABr_3$, a significant improvement of $V_{OC}$ in perovskite compositions was observed with high bromide concentration. The corresponding tDOS results further validate the reduced deep trap density in $TPABr_3$-perovskite devices with different compositions (inset E in FIG. 1). As a result, the 1.65 eV and 1.69 eV $TPABr_3$-perovskites can achieve high VOCs of 1.23 and 1.25 V, respectively (inset B in FIG. 1).

TABLE 1

Photovoltaic parameters of $Cs_{0.1}FA_{0.2}MA_{0.7}Pb(I_{1-x}Br_x)_3$ solar cells with and without $TPABr_3$.

| Composition | Bandgap (eV) | With or without $TPABr_3$ | $V_{OC}$ (V) | $J_{SC}$ (mA/cm$^2$) | FF | PCE (%) |
|---|---|---|---|---|---|---|
| $Cs_{0.1}FA_{0.2}MA_{0.7}PbI_3$ | 1.56 | w/o | 1.15 | 22.9 | 0.821 | 21.6 |
| | | w/ | 1.16 | 22.9 | 0.823 | 21.8 |
| $Cs_{0.1}FA_{0.2}MA_{0.7}Pb(I_{0.95}Br_{0.05})_3$ | 1.59 | w/o | 1.16 | 22.4 | 0.801 | 20.8 |
| | | w/ | 1.18 | 22.4 | 0.809 | 21.4 |
| $Cs_{0.1}FA_{0.2}MA_{0.7}Pb(I_{0.90}Br_{0.10})_3$ | 1.63 | w/o | 1.16 | 21.8 | 0.817 | 20.6 |
| | | w/ | 1.21 | 21.9 | 0.815 | 21.6 |
| $Cs_{0.1}FA_{0.2}MA_{0.7}Pb(I_{0.85}Br_{0.15})_3$ | 1.65 | w/o | 1.17 | 20.9 | 0.786 | 19.3 |
| | | w/ | 1.23 | 21.2 | 0.813 | 21.2 |
| $Cs_{0.1}FA_{0.2}MA_{0.7}Pb(I_{0.80}Br_{0.20})_3$ | 1.69 | w/o | 1.18 | 20.1 | 0.782 | 18.5 |
| | | w/ | 1.25 | 20.2 | 0.818 | 20.7 |

Example 2: Thick WBG Perovskite Single Junction Solar Cells

Figure 8:
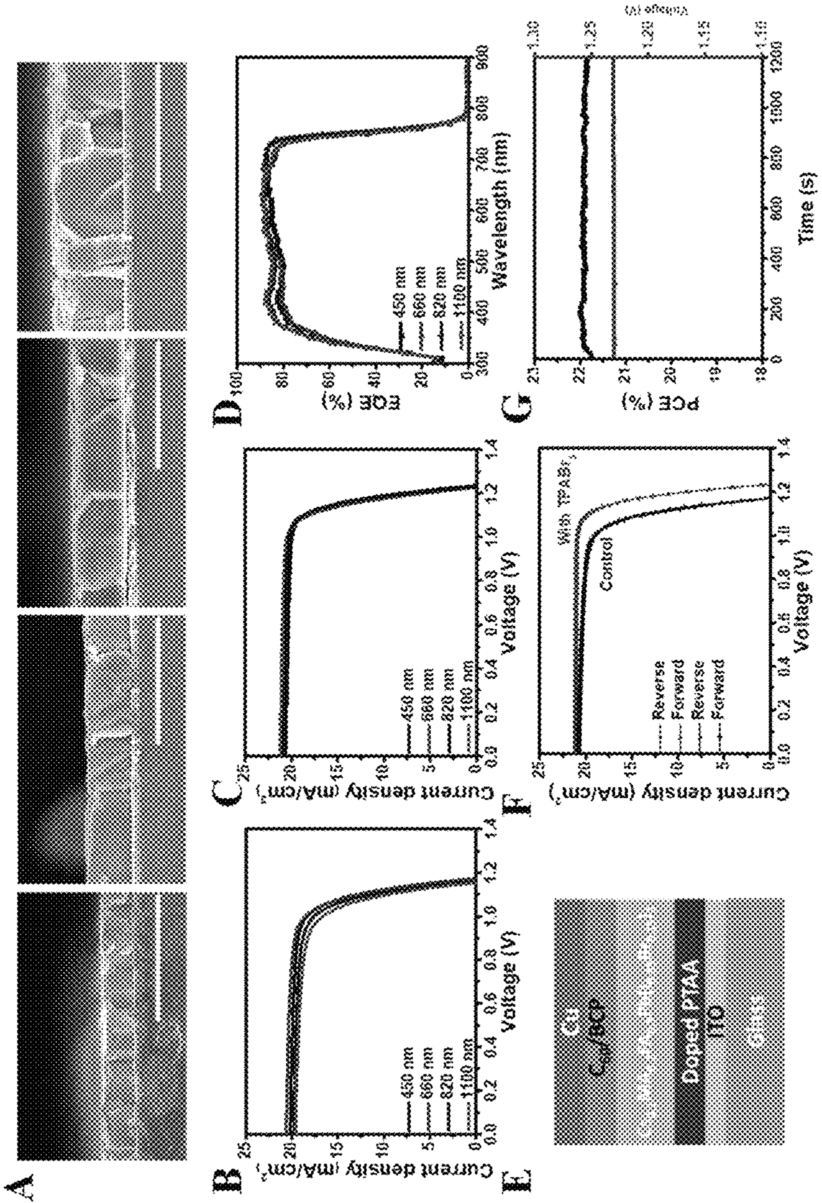
FIG. 8 shows the thickness-dependent photovoltaic performance of WBG perovskite solar cells and electroluminescent performance of WBG solar cells. (A) Cross-sectional SEM images of WBG perovskite films with different thickness. The scale bar is 2 μm. (B) and (C) J-V curves of control WBG and WBG-$TPABr_3$ perovskite devices. (D) EQE spectra of WBG perovskite devices with $TPABr_3$. (E) Device structure of single-junction opaque WBG perovskite solar cells. (F) J-V curves of best-performing control devices and 0.2 mol % $TPABr_3$-incorporated devices based on $Cs_{0.1}FA_{0.2}MA_{0.7}Pb(I_{0.85}Br_{0.15})_3$. (G) Stabilized PCE and $V_{OC}$ of $TPABr_3$-modified opaque WBG perovskite cell at a maximum power point under 1-sun illumination.

The influence of $TPABr_3$ additive on thick perovskite device performance was examined. Triple-cation WBG perovskite $Cs_{0.1}FA_{0.2}MA_{0.7}Pb(I_{0.85}Br_{0.15})_3$ with a bandgap of 1.65 eV was used as an example. $TPABr_3$ addition (0.2 mol %) did not significantly change the WBG perovskite film morphology as shown by the scanning electron microscopy (SEM) images in FIG. 7. The significantly reduced bulk trap state density in $TPABr_3$-WBG perovskites should enhance the performance of thicker WBG perovskite cells. To verify thus, the performance of WBG perovskite devices was measured with different thicknesses ranging from 450 to 1100 nm (cross-section SEM images are shown in inset A in FIG. 8). Insets B and C in FIG. 8 show the J-V curves of the devices without and with $TPABr_3$ and the corresponding photovoltaic parameters are summarized in Table 2. For the control devices, when the perovskite film thickness increased from 450 to 660 nm, the device efficiency slightly improved from 18.3% to 18.6%, which could be attributed to increased short-circuit current density ($J_{SC}$) from enhanced light absorption. Further increasing WBG perovskite film thickness resulted in lower device efficiency due to the reduced FF and $J_{SC}$ In contrast, the efficiencies of $TPABr_3$-WBG perovskite devices were much less sensitive to perovskite thickness, suggesting a reduced charge recombination and longer carrier diffusion length for the $TPABr_3$-WBG perovskites. Inset D in FIG. 8 shows the corresponding external quantum efficiency (EQE) spectra, which support the $J_{SC}$ results.

TABLE 2

J-V characteristics of opaque perovskite solar cells (with and without $TPABr_3$) with different perovskite thicknesses.

| Thickness (nm) | Device | $V_{OC}$ (V) | $J_{SC}$ (mA/cm$^2$) | FF | PCE (%) |
|---|---|---|---|---|---|
| 450 | Control | 1.17 | 20.18 | 0.78 | 18.32 |
| | With $TPABr_3$ | 1.23 | 20.66 | 0.81 | 20.58 |
| 660 | Control | 1.17 | 20.60 | 0.77 | 18.59 |
| | With $TPABr_3$ | 1.23 | 20.91 | 0.81 | 20.91 |
| 820 | Control | 1.16 | 19.77 | 0.76 | 17.62 |
| | With $TPABr_3$ | 1.23 | 20.83 | 0.82 | 21.02 |
| 1100 | Control | 1.15 | 19.60 | 0.75 | 16.87 |
| | With $TPABr_3$ | 1.23 | 21.23 | 0.80 | 20.89 |

Figure 9:
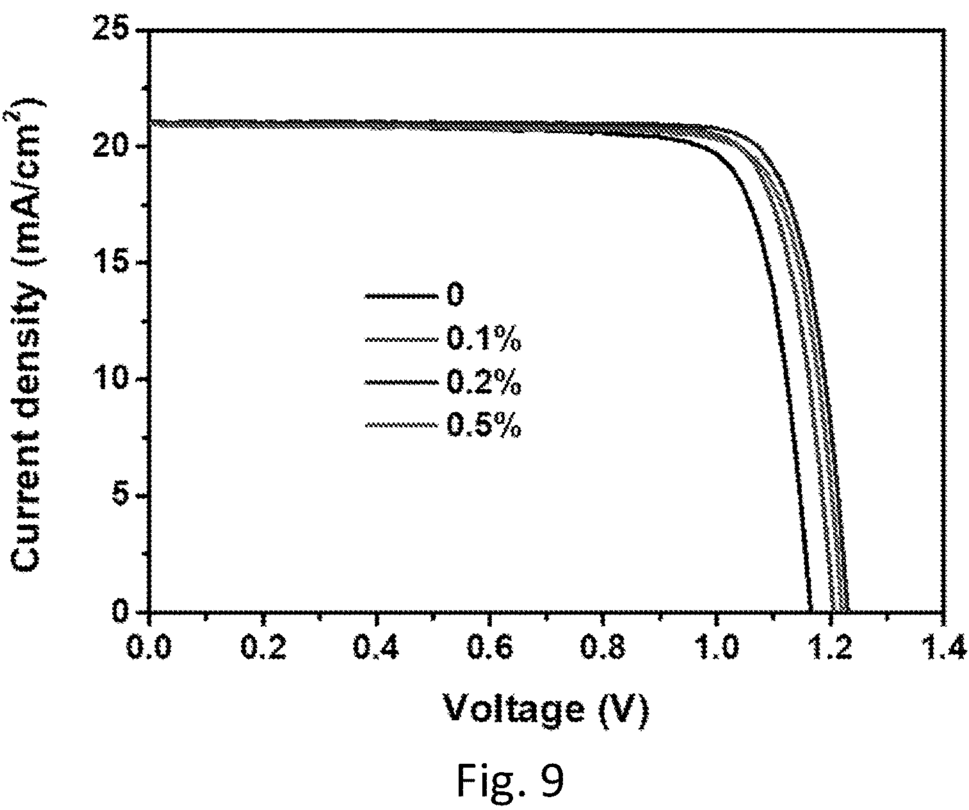
FIG. 9 shows a plot of the J-V characteristics of WBG PSCs with different molar ratios of $TPABr_3$ with respect to Pb.
Figure 10:
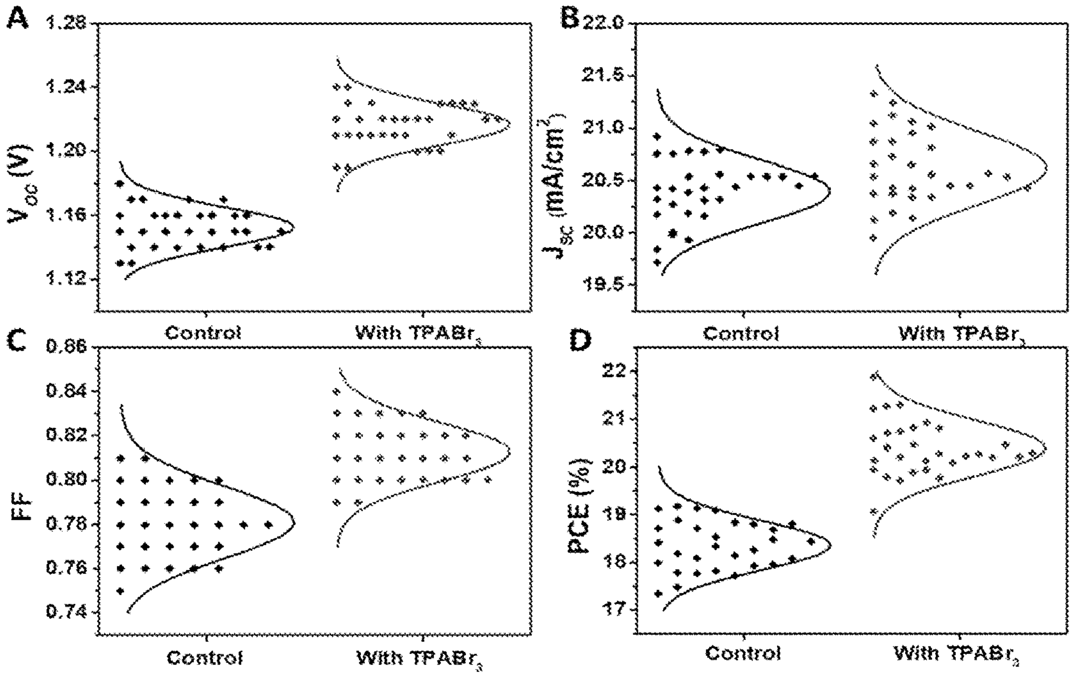
FIG. 10 shows the statistical results of $Cs_{0.1}FA_{0.2}MA_{0.7}Pb(I_{0.85}Br_{0.15})_3$ cells with and without $TPABr_3$ obtained from 30 individual cells of each type, for each of $V_{OC}$ (A), $J_{SC}$ (B), FF (C), and PCE (D).
Figure 11:
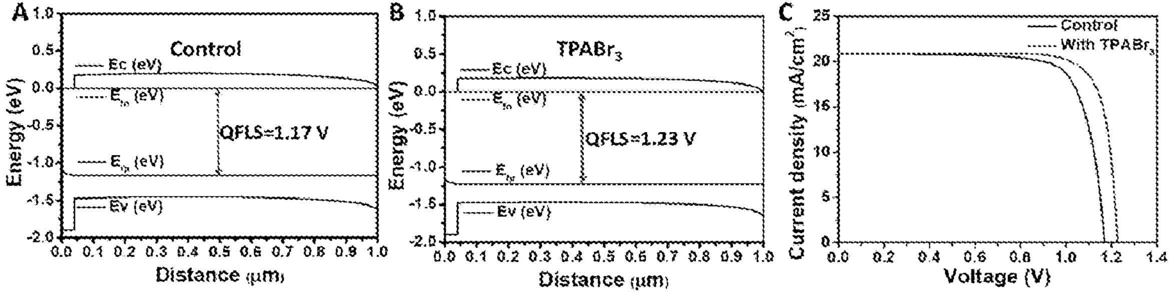
FIG. 11 shows (A) and (B) simulated band diagrams of WBG perovskite devices under one sun illumination without and with $TPABr_3$. (C) Simulated J-V curves.

The J-V characteristics of ~1-μm-thick WBG perovskite devices with different concentrations of $TPABr_3$ (0.1, 0.2, 0.5 mol % with respect to Pb) were also measured, the results for which are shown in FIG. 9. The optimal concentration of $TPABr_3$ was found to be 0.2 mol %. The J-V curves of a champion ~1-μm-thick control device and a device with 0.2 mol % $TPABr_3$ are shown in inset F of FIG. 8. The devices have an architecture of indium tin oxide (ITO) glass/poly(triarylamine) (PTAA) doped with 15 wt % 4-isopropyl-4'-methyldiphenyliodonium tetrakis-(pentafluoro-phenyl)borate (TPFB)/$Cs_{0.1}FA_{0.2}MA_{0.7}Pb(I_{0.85}Br_{0.15})_3$/$C_{60}$/BCP/Cu (inset A in FIG. 8). The best-performing WBG perovskite cell with 0.2 mol % $TPABr_3$ delivered a $V_{OC}$ of 1.23 V, a $J_{SC}$ of 21.2 mA/cm$^2$, and a FF of 0.838, resulting in a PCE of 21.9%. The stabilized efficiency was measured to be 21.8% (inset G in FIG. 8). WBG PSCs having a similar bandgap have not been able to achieve such high stabilized PCE (8, 25-27). The $V_{OC}$ of 1.23 V was also confirmed by measuring the stabilized $V_{OC}$ for 20 min (inset G in FIG. 8). In contrast, the champion control device exhibited a PCE of 19.1% with a lower $V_{OC}$ of 1.17 V and FF of 0.789. The statistic photovoltaic parameters of two types of cells with 30 individual devices for each group are shown in FIG. 10. The cells with $TPABr_3$ exhibited an increased averaged $V_{OC}$ of 1.22 V and averaged FF of 0.817, leading to an averaged PCE of 21.0%. Without wishing to be bound by theory, the high $V_{OC}$ for 1.65 eV WBG perovskites with $V_{OC}$ deficit of 0.42 V could be ascribed to suppressed non-radiative recombination within the WBG perovskites. To have a better understanding of the effect of the additive on device performance, WBG perovskite device performance was simulated with different trap densities determined from DLCP measurements using Solar Cell Capacitance Simulator (SCAPS) software (FIG. 11 and Table 3)(28). The computation results show that the deep trap density reduction results in a higher quasi-Fermi-level splitting from 1.17 V to 1.23 V, in agreement with the experimental $V_{OC}$ results.

TABLE 3

SCAPS simulation parameters used for WBG perovskite solar cells.

| Parameters | PTAA | Perovskite | $C_{60}$ |
|---|---|---|---|
| Thickness (nm) | 10 | 1000 | 25 |
| Bandgap (eV) | 3.6 | 1.65 | 1.9 |
| Electron affinity (eV) | 1.8 | 3.93 | 4.1 |
| Relative dielectric permittivity | 3 | 31 | 5 |
| CB effective DOS ($1/cm^3$) | 5.00E18 | 2.00E18 | 2.00E18 |
| VB effective DOS ($1/cm^3$) | 5.00E18 | 2.00E18 | 2.00E18 |
| Electron mobility ($cm^2/Vs$) | 1.00E−3 | 1.00E1 | 1.00E−2 |
| Hole mobility ($cm^2/Vs$) | 1.00E−3 | 1.00E1 | 1.00E−2 |
| Shallow donor density ND ($1/cm^3$) | 0.00 | 1.00E11 | 2.00E18 |
| Shallow acceptor density NA ($1/cm^3$) | 2.00E17 | 1.00E13 | 0.00 |
| Radiative recombination coefficient ($cm^3/s$) | 0.00 | 1.00E−12 | 0.00 |

Note:
Trap distributions in WBG perovskites determined from DLCP measurements.

Example 3: Transport and Recombination Property Changes

To understand the impact of $TPABr_3$ on the charge transport and recombination dynamics of the WBG perovskites, a series of measurements was carried out. First, a transient photovoltage (TPV) measurement was used to compare the charge carrier recombination lifetime of the control and $TPABr_3$-based devices with one-sun light bias. The carrier recombination lifetime obtained from TPV decay curves increased from 0.57 μs to 1.24 μs upon $TPABr_3$ incorporation. Light intensity-dependent $V_{OC}$ measurements were performed, which can present key correlations between diode ideality factor ($n_{id}$) and charge recombination behavior. As shown in inset B in FIG. 12, the plot of $V_{OC}$ as a function of light intensity on a logarithmic scale is linearly fitted to evaluate the slope ($n_{id}$), which usually represents the degree of trap-mediated nonradiative recombination. The $n_{id}$ of the $TPABr_3$-based cell is 1.19, representing a more ideal diode. In contrast, a relatively higher $n_{id}$ of 1.92 was obtained for the control device, which indicates a severe trap-assisted recombination. Steady-state photoluminescence (PL) measurements were used to identify the defect reduction effect by $TPABr_3$ molecules. The PL intensity of $TPABr_3$-WBG film increased by nearly 3 times. Furthermore, confocal PL mapping measurements were carried out to characterize the spatial distribution of PL intensity and PL lifetime. The mean PL intensity and lifetime were significantly enhanced with a uniform distribution for the WBG perovskite film with $TPABr_3$, showing that it universally enhanced the whole film, rather than merely at grain boundaries.

Figure 12:
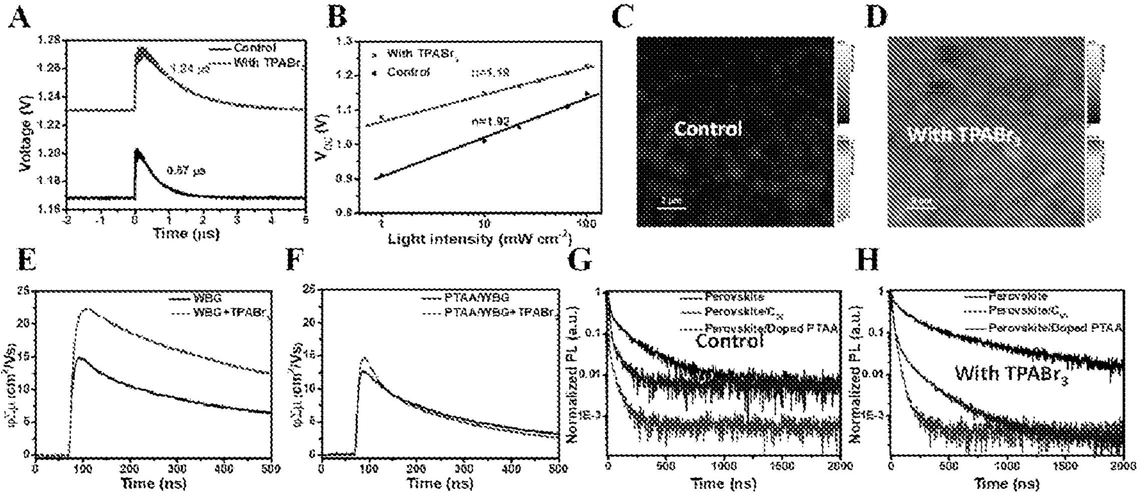
FIG. 12 shows plots and images exhibiting the optoelectronic properties of WBG perovskite films and devices. (A) Carrier recombination lifetime measured by TPV. (B) Light intensity dependence of $V_{OC}$ with corresponding slopes by linear fitting. (C) and (D) Confocal PL intensity and lifetime maps. Photoconductivity transients of WBG perovskite films deposited on neat quartz substrates (E) and on PTAA-coated quartz substrates (F). (G) and (H) Time-resolved PL decays of the samples with different charge extraction layers.

To understand which type of charge traps was reduced, the photoconductivity of the perovskite films was measured with charge transport layers, either PTAA or PCBM, to extract one charge type. Inset E in FIG. 12 shows a comparison of photoconductivity in WBG perovskite films, from which the associated mobilities and lifetime of free carriers can be extracted. For the bare perovskite films, the $TPABr_3$-containing WBG perovskite film exhibited a 49% improvement in carrier mobility, as the peak $\phi\Sigma\mu$ increased from 14.9 to 22.3 $cm^2/Vs$, representing the sum of electron and hole mobilities in the perovskite films. Additionally, a bi-exponential fitting of the photoconductance decay showed an improved recombination lifetime of mobile carriers in the $TPABr_3$-containing film (738 ns) compared to the control (418 ns). For the perovskite/PTAA bilayer sample (inset F in FIG. 12), the peak $\phi\Sigma\mu$ value dropped from 22.3 to 14.7 $cm^2/Vs$. Since the holes are extracted from the perovskite to PTAA, the photoconductivity signal is dominated by electrons, meaning the electron mobility in $TPABr_3$-based perovskite films is larger than that in the control sample. The increased electron mobility and recombination lifetime in WBG perovskites is consistent with the decreased positively-charged $I_i^+$ densities after adding $TPABr_3$.

The charge carrier diffusion length of electrons and holes in WBG perovskite films was obtained using a PL quenching study, in which $C_{60}$ and PTAA were again used as electron and hole quenchers (insets G and H in FIG. 12), respectively (29). Here, a quick reduction of TRPL lifetime compared to the control sample indicates a longer carrier diffusion length. The TRPL lifetime of WBG perovskite film in the absence of charge extraction layers ranged from 141 to 453 ns for control and $TPABr_3$-containing samples, respectively. For the WBG perovskites without $TPABr_3$, the PL lifetime reduced to 79 ns and 28 ns for the films coated with PTAA and $C_{60}$, respectively. The carrier diffusion length in 800 nm-thick control perovskite films is therefore estimated to be 1071 nm for holes and 482 nm for electrons. As shown by the investigations, the electrons in the pristine WBG perovskites were trapped. The $TPABr_3$-containing WBG films showed significantly enhanced diffusion length for both electrons (1484 nm) and holes (2190 nm), a near-threefold increase in electron diffusion length, again supporting that $TPABr_3$ reduced the electron traps.

Example 4: Monolithic Perovskite/Silicon Tandem Cells

Figure 13:
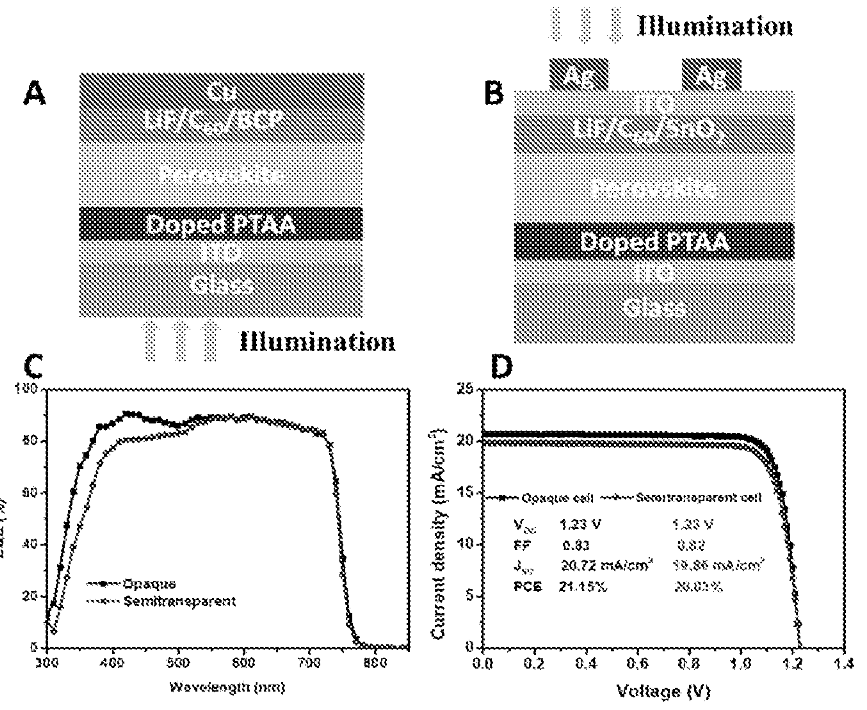
FIG. 13 shows in (A) and (B) schematics of opaque and semitransparent cell architecture. (C) and (D) show EQE and J-V curves of opaque (bottom illumination) and semitransparent (top illumination) cells, respectively.
Figure 14:
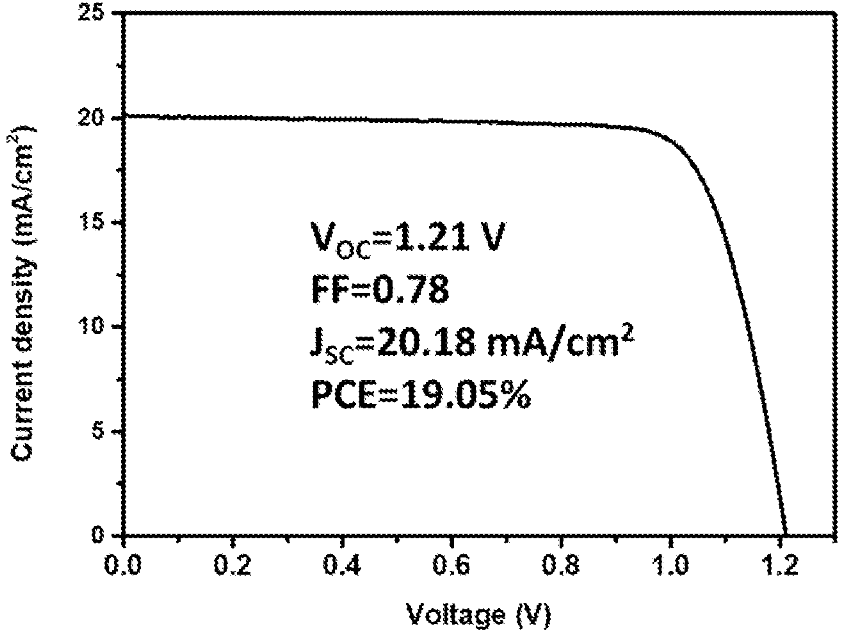
FIG. 14 shows a J-V curve of a representative 1-$cm^2$ semitransparent device disclosed herein.

To evaluate the WBG perovskites for perovskite/silicon tandem solar cells, single-junction opaque and semitransparent devices were developed (FIG. 13) to evaluate whether the WBG perovskites could survive the prolonged thermal stress and moisture during ALD $SnO_2$ growth process and subsequent ITO sputtering. Compared to the opaque device, the top-illuminated semitransparent device showed comparable FF and $V_{OC}$, but smaller $J_{SC}$ due to the parasitic absorption by the front ITO and $C_{60}$ layers. The top-illuminated semitransparent cell with an efficiency over 20.0% also demonstrates good compatibility with ALD and the sputtering process. Large area (1.04 $cm^2$) semitransparent solar cells and the best-performing single junction WBG device exhibited an efficiency of 19.1% (FIG. 14).

Figure 15:
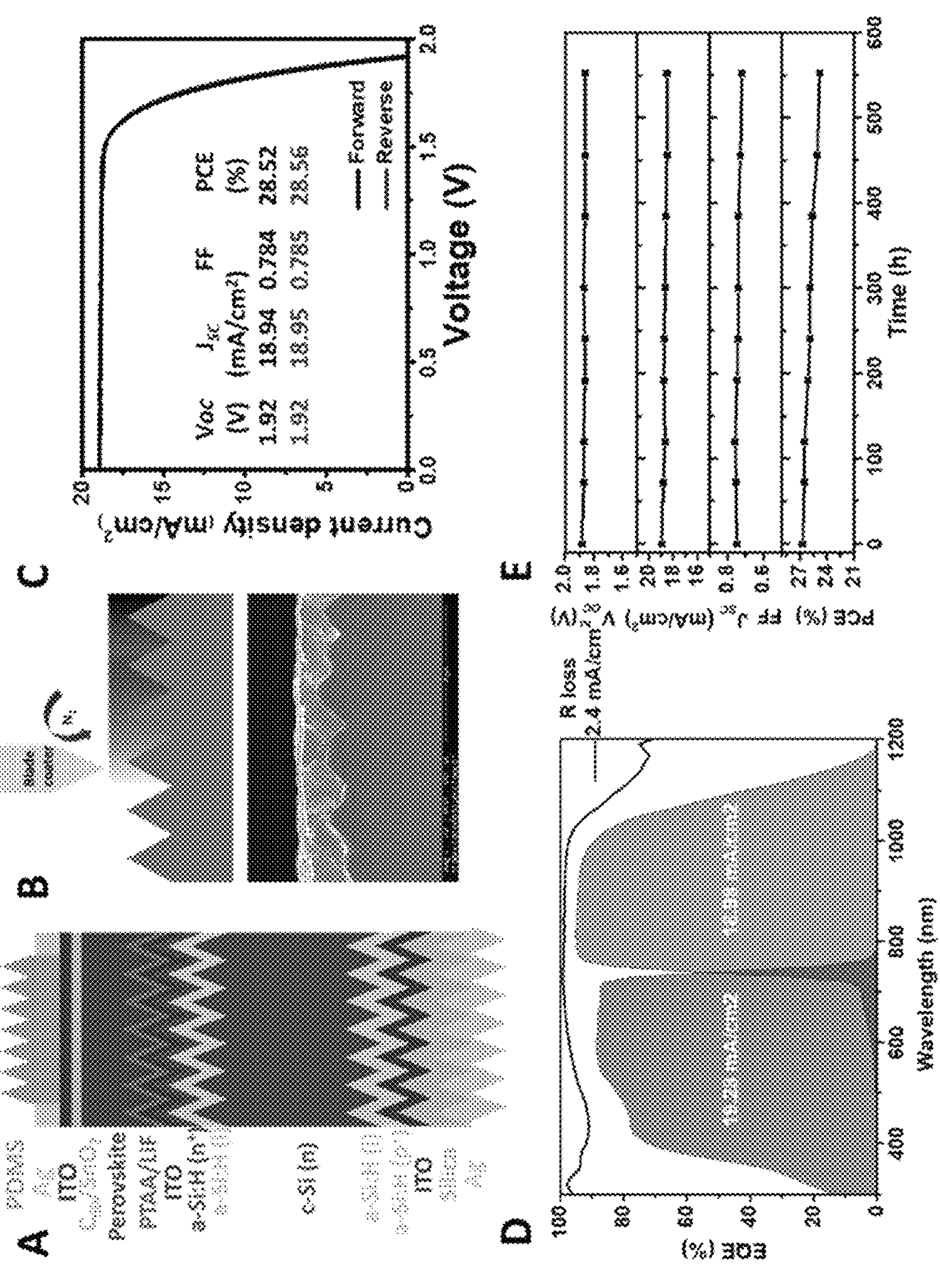
FIG. 15 shows the characterization of the photovoltaic performance and operational stability of perovskite/silicon tandem solar cells. (A) Device structures of perovskite/ silicon tandem cells. (B) Schematic illustration for blade coating of WBG perovskite films on textured c-Si. Cross-sectional SEM images of blade-coated WBG perovskite films on textured c-Si. (C) J-V curves of champion monolithic perovskite/silicon tandem solar cell. (D) EQE of tandem cell. (E) Operational stability of encapsulated tandem device in air at 25° C.

Perovskite/silicon tandem solar cells were then fabricated by blade coating optimized 1.65-eV WBG perovskites on fully textured silicon bottom cells with a mean texture size of 0.43 μm(11, 31). The architecture of the perovskite/silicon tandem cells is shown in inset A of FIG. 15. The WBG perovskites deposited on textured silicon cells by air knife-assisted blade-coating is illustrated in inset B of FIG. 15. The cross-section scanning electron microscopy (SEM) image in inset C of FIG. 15 shows that textured silicon bottom cells can be fully covered with micrometer-thick perovskite films. As illustrated in FIG. 16, two main shunting pathways exist in the tandem configuration. The first pathway shows that pyramids are not fully covered by WBG perovskites. However, this can be addressed by blade coating high-quality thick WBG perovskite layers. The second pathway is that the blade-coated PTAA layer may expose the pyramid roof and lead to direct ITO (recombination junction layer)/perovskite contact. Here, a simple method is presented to block shunting paths between WBG perovskite and ITO via depositing thermal-evaporated LiF on top of the PTAA layer to form conformal contact. LiF interlayer exhibits a synergistic function: block the shunting layer and the interface passivation layer. As shown in FIG. 17, a single-junction perovskite device based on a LiF layer on top of PTAA exhibited a 20-mV enhancement in $V_{OC}$. The yield of the tandem devices was compared with and without the LiF interlayer. The LiF-based tandems showed improved reproducibility with reduced shunting proportion (FIG. 18). The best-performing tandem cell showed hysteresis-free JV curves, with a PCE of 28.6%, a $V_{OC}$ of 1.92 V, a $J_{SC}$ of 19.0 mA/cm$^2$, and an FF of 0.785. The PCE of 28.5% was also recorded after continuous illumination at 1-sun simulated light for 20 min (FIG. 19). Inset D in FIG. 15 shows the EQE spectra of the champion tandem cell, which reveals matched photocurrent between the subcells. The $J_{SC}$ integrated from the EQE spectra matched that extracted from the J-V curves. To validate the reproducibility of the method, 27 tandem devices in five different batches were fabricated, and the statistics of the devices parameters are shown in FIG. 20. The tandem cells with $TPABr_3$ exhibited excellent reproducibility with an averaged PCE of 27.0%.

The photostability of WBG perovskite films and devices was also examined. The PL stability of WBG perovskite films was monitored with and without $TPABr_3$ at continuous 10-sun equivalent 640-nm laser illumination (FIG. 21). Light induced halide phase segregation was observed in the control WBG films (17). No obvious PL peak shift or splitting appeared in $TPABr_3$-WBG perovskites under continuous 10-sun illumination after 120 min in ambient air. Without wishing to be bound by theory, the enhanced photostability may be explained by reducing iodine initials, which is the channel for iodine migration(32). To further verify this, a temperature-dependent conductivity measurement was performed to obtain activation energy ($E_A$) for ion migration. Based on the Arrhenius plot shown in FIG. 22, an $E_A$ of 0.186 eV was extracted for control WBG films, which is comparable to the measured value in pure iodide perovskites(33). In contrast, a nearly doubled $E_A$ (0.336 eV) in $TPABr_3$-WBG films was obtained, indicating that halide migration was significantly suppressed by reducing I interstitials.

The operational stability of encapsulated semitransparent devices was then investigated at maximum power point under 1-sun illumination in ambient air (temperature: 25° C., humidity: 30-60%) (27). The evolution of corresponding device photovoltaic parameters is shown in FIG. 23. The encapsulated semitransparent device with $TPABr_3$ could retain ~90% of its initial value after 520 hours, while the control device could only keep 40% of its initial efficiency after 300 hours under the same testing condition. As shown in FIG. 24, the encapsulated tandem device maintained 93% of its initial efficiency after 550 hours of a MPP tracking test. This considerable improvement in operational stability for both single junction and tandem devices is attributed to suppressed ion migration by incorporating $TPABr_3$ into WBG perovskites.

Provided in Tables 4 and 5 are summaries of the performance characteristics of the solar cells disclosed herein compared to those of the art.

TABLE 4

Performance summary of single-junction WBG perovskite solar cells reported in perovskite-silicon tandems

| Composition | Bandgap (eV) | $V_{OC}$ (V) | $V_{OC}$ deficit (V) | FF | $J_{SC}$ (mA/cm$^2$) | PCE (%) | Ref |
|---|---|---|---|---|---|---|---|
| $[Cs_{0.22}FA_{0.78}Pb(I_{0.85}Br_{0.15})_3]_{0.97}(MAPbCl_3)_{0.03}$ | 1.67 | 1.22 | 0.45 | 0.832 | 20.20 | 20.4 | (2a) |
| $Cs_{0.05}(FA_{0.77}MA_{0.23})_{0.95}Pb(I_{0.77}Br_{0.23})_3$. | 1.68 | 1.224 | 0.466 | 0.82 | 20.70 | 20.8 | (3a) |
| $Cs_{0.1}MA_{0.9}Pb(I_{0.9}Br_{0.1})_3$ | 1.63 | 1.167 | 0.463 | 0.82 | 21.00 | 20.1 | (4a) |
| $(FA_{0.65}MA_{0.2}Cs_{0.15})Pb(I_{0.8}Br_{0.2})_3$ | 1.68 | 1.20 | 0.48 | n/a | n/a | 20.7 | (5a) |
| $Cs_{0.15}(FA_{0.83}MA_{0.17})_{0.85}Pb(I_{0.8}Br_{0.2})_3$ | 1.64 | 1.15 | 0.49 | 0.804 | 20.90 | 19.3 | (6a) |
| $Cs_{0.1}FA_{0.2}MA_{0.7}Pb(I_{0.85}Br_{0.15})_3$ | 1.65 | 1.25 | 0.43 | 0.83 | 21.1 | 21.9 | This work |

TABLE 5

Comparison of reported high-efficiency perovskite/silicon tandem solar cells

| Si architecture | Method for perovskite deposition | $V_{OC}$ (V) | $J_{SC}$ (mA/cm$^2$) | FF | PCE (%) | Ref |
|---|---|---|---|---|---|---|
| Flat | Spin coating | 1.90 | 19.26 | 0.795 | 29.15 | (3a) |
| Flat | Spin coating | 1.886 | 19.12 | 0.753 | 27.13 | (2a) |
| Flat | Spin coating | 1.756 | 19.2 | 0.792 | 26.7 | (5a) |
| Textured | Vacuum deposition | 1.788 | 19.53 | 0.731 | 25.24 | (7a) |
| Textured | Blade coating | 1.82 | 19.2 | 0.753 | 26.2 | (4a) |
| Textured | Spin coating | 1.78 | 19.1 | 0.756 | 25.71 | (8a) |
| Textured | Vacuum deposition | 1.735 | 19.8 | 0.731 | 25.1 | (9a) |
| Textured | Blade coating | 1.92 | 18.95 | 0.786 | 28.56 | This work |

REFERENCES

1. J. Jeong et al., Pseudo-halide anion engineering for α-FAPbI 3 perovskite solar cells. *Nature,* 1-5 (2021).
2. K. A. Bush et al., 23.6%-efficient monolithic perovskite/silicon tandem solar cells with improved stability. *Nature Energy* 2, 1-7 (2017).
3. Q. Han et al., High-performance perovskite/Cu (In, Ga) Se2 monolithic tandem solar cells. *Science* 361, 904-908 (2018).
4. Z. Li et al., Wide-Bandgap Perovskite/Gallium Arsenide Tandem Solar Cells. *Advanced Energy Materials* 10, 1903085 (2020).
5. G. E. Eperon et al., Perovskite-perovskite tandem photovoltaics with optimized band gaps. *Science* 354, 861-865 (2016).
6. Z. Yu et al., Simplified interconnection structure based on C 60/SnO 2-x for all-perovskite tandem solar cells. *Nature Energy* 5, 657-665 (2020).
7. K. Xiao et al., All-perovskite tandem solar cells with 24.2% certified efficiency and area over 1 cm 2 using surface-anchoring zwitterionic antioxidant. *Nature Energy* 5, 870-880 (2020).
8. A. Al-Ashouri et al., Monolithic perovskite/silicon tandem solar cell with>29% efficiency by enhanced hole extraction. *Science* 370, 1300-1309 (2020).
9. A. Alasfour, J. Y. Zhengshan, W. Weigand, D. Quispe, Z. C. Holman, Sub-micrometer random-pyramid texturing of silicon solar wafers with excellent surface passivation and low reflectance. *Solar Energy Materials and Solar Cells* 218, 110761 (2020).
10. F. Sahli et al., Fully textured monolithic perovskite/silicon tandem solar cells with 25.2% power conversion efficiency. *Nature materials* 17, 820-826 (2018).
11. B. Chen et al., Blade-coated perovskites on textured silicon for 26%-efficient monolithic perovskite/silicon tandem solar cells. *Joule*, (2020).
12. Y Hou et al., Efficient tandem solar cells with solution-processed perovskite on textured crystalline silicon. *Science* 367, 1135-1140 (2020).
13. D. Kim et al., Efficient, stable silicon tandem cells enabled by anion-engineered wide-bandgap perovskites. *Science* 368, 155-160 (2020).
14. E. Lamanna et al., Mechanically Stacked, Two-Terminal Graphene-Based Perovskite/Silicon Tandem Solar Cell with Efficiency over 26%. *Joule*, (2020).
15. J. Jeong et al., Pseudo-halide anion engineering for α-FAPbI 3 perovskite solar cells. *Nature* 592, 381-385 (2021).
16. M. Jeong et al., Stable perovskite solar cells with efficiency exceeding 24.8% and 0.3-V voltage loss. *Science* 369, 1615-1620 (2020).
17. E. T. Hoke et al., Reversible photo-induced trap formation in mixed-halide hybrid perovskites for photovoltaics. *Chemical Science* 6, 613-617 (2015).
18. T. C. J. Yang, P. Fiala, Q. Jeangros, C. Ballif, High-bandgap perovskite materials for multijunction solar cells. *Joule* 2, 1421-1436 (2018).
19. S. Mahesh et al., Revealing the origin of voltage loss in mixed-halide perovskite solar cells. *Energy & Environmental Science* 13, 258-267 (2020).
20. Y Deng et al., Tailoring solvent coordination for high-speed, room-temperature blading of perovskite photovoltaic films. *Science advances* 5, eaax7537 (2019).
21. S. Mahesh et al., Revealing the origin of voltage loss in mixed-halide perovskite solar cells. *Energy & Environmental Science* 13, 258-267 (2020).
22. D. Meggiolaro et al., Iodine chemistry determines the defect tolerance of lead-halide perovskites. *Energy & Environmental Science* 11, 702-713 (2018).
23. E. Mosconi, F. De Angelis, Mobile ions in organohalide perovskites: interplay of electronic structure and dynamics. *ACS Energy Letters* 1, 182-188 (2016).
24. A. Mannodi-Kanakkithodi, J. S. Park, A. B. F. Martinson, M. K. Y. Chan, Defect Energetics in Pseudo-Cubic Mixed Halide Lead Perovskites from First-Principles. *The Journal of Physical Chemistry C* 124, 16729-16738 (2020).
25. G. Yang et al., Stable and low-photovoltage-loss perovskite solar cells by multifunctional passivation. *Nature Photonics,* 1-9 (2021).
26. M. Saliba et al., Incorporation of rubidium cations into perovskite solar cells improves photovoltaic performance. *Science* 354, 206-209 (2016).
27. J. Xu et al., Triple-halide wide-band gap perovskites with suppressed phase segregation for efficient tandems. *Science* 367, 1097-1104 (2020).
28. M. Burgelman, P. Nollet, S. Degrave, Modelling polycrystalline semiconductor solar cells. *Thin solid films* 361, 527-532 (2000).
29. G. Xing et al., Long-Range Balanced Electron- and Hole-Transport Lengths in Organic-Inorganic CH3NH3PbI3. *Science* 342, 344-347 (2013).
30. B. Shi, L. Duan, Y Zhao, J. Luo, X. Zhang, Semitransparent perovskite solar cells: from materials and devices to applications. *Advanced materials* 32, 1806474 (2020).
31. M. Ju et al., Influence of small size pyramid texturing on contact shading loss and performance analysis of Ag-screen printed mono crystalline silicon solar cells. *Materials Science in Semiconductor Processing* 85, 68-75 (2018).
32. A. Ruth et al., Vacancy-Mediated Anion Photosegregation Kinetics in Mixed Halide Hybrid Perovskites: Coupled Kinetic Monte Carlo and Optical Measurements. *ACS Energy Letters* 3, 2321-2328 (2018).
33. J. M. Azpiroz, E. Mosconi, J. Bisquert, F. De Angelis, Defect migration in methylammonium lead iodide and its role in perovskite solar cell operation. *Energy & Environmental Science* 8, 2118-2127 (2015).
2a. J. Xu et al., Triple-halide wide-band gap perovskites with suppressed phase segregation for efficient tandems. *Science* 367, 1097-1104 (2020).
3a. A. Al-Ashouri et al., Monolithic perovskite/silicon tandem solar cell with>29% efficiency by enhanced hole extraction. *Science* 370, 1300-1309 (2020).
4a. B. Chen et al., Blade-coated perovskites on textured silicon for 26%-efficient monolithic perovskite/silicon tandem solar cells. *Joule*, (2020).
5a. D. Kim et al., Efficient, stable silicon tandem cells enabled by anion-engineered wide-bandgap perovskites. *Science* 368, 155-160 (2020).
6a. B. Chen et al., Grain Engineering for Perovskite/Silicon Monolithic Tandem Solar Cells with Efficiency of 25.4%. *Joule* 3, 177-190 (2019).
7a. F. Sahli et al., Fully textured monolithic perovskite/silicon tandem solar cells with 25.2% power conversion efficiency. *Nature materials* 17, 820-826 (2018).
8a. Y. Hou et al., Efficient tandem solar cells with solution-processed perovskite on textured crystalline silicon. *Science* 367, 1135-1140 (2020).
9a. E. Aydin et al., Interplay between temperature and bandgap energies on the outdoor performance of perovskite/silicon tandem solar cells. *Nature Energy* 5, 851-859 (2020).

Efforts have been made to ensure accuracy with respect to numbers used (e.g., amounts, temperature, etc.) but some experimental errors and deviations should be accounted for.

One skilled in the art will recognize many methods and materials similar or equivalent to those described herein, which could be used in the practicing the subject matter described herein. The present disclosure is in no way limited to just the methods and materials described.

Unless defined otherwise, technical and scientific terms used herein have the same meaning as commonly understood by one of ordinary skill in the art to which this subject matter belongs.

Throughout this specification and the claims, the words "comprise," "comprises," and "comprising" are used in a non-exclusive sense, except where the context requires otherwise. It is understood that embodiments described herein include "consisting of" and/or "consisting essentially of" embodiments.

Where a range of values is provided, it is understood that each intervening value, to the tenth of the unit of the lower limit, unless the context clearly dictates otherwise, between the upper and lower limit of the range and any other stated or intervening value in that stated range, is encompassed. The upper and lower limits of these small ranges which may independently be included in the smaller rangers is also encompassed, subject to any specifically excluded limit in the stated range. Where the stated range includes one or both of the limits, ranges excluding either or both of those included limits are also included.

Many modifications and other embodiments set forth herein will come to mind to one skilled in the art to which this subject matter pertains having the benefit of the teachings presented in the foregoing descriptions and the associated drawings. Therefore, it is to be understood that the subject matter is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An ink solution, comprising:

(i) a perovskite precursor composition of Formula I:

$$APbI_{3-z}Br_z \quad (I),$$

wherein,

A is a cation selected from the group consisting of methylammonium (MA), tetramethylammonium (TMA), formamidinium (FA), cesium (Cs), rubidium (Rb), potassium (K), sodium (Na), butylammonium (BAH), phenethylammonium (PEA), phenylammonium (PHA), and guanidinium (GU), or a combination thereof; and z is between 0.01 and 1.0;

(ii) a tribromide salt;

and (iii) a solvent.

2. The ink solution of claim 1, wherein the tribromide salt is present in the ink solution at a molar ratio of about 0.05 to about 1.0% relative to the composition of Formula I.

3. The ink solution of claim 2, wherein the tribromide salt is present in the ink solution at a molar ratio of about 0.1 to about 0.5% relative to the composition of Formula I.

4. The ink solution of claim 2 or 3, wherein the tribromide salt is present in the ink solution at a molar ratio of about 0.2% relative to the composition of Formula I.

5. The ink solution of claim 1, wherein the tribromide salt is selected from the group consisting of tetrabutylammonium tribromide, tetramethylammonium tribromide, trimethylphenylammonium tribromide, hexamethylenetetramine tribromide, pyridinium tribromide, 4-(dimethylamino)pyridinium tribromide, boron tribromide, phosphorus tribromide, aluminum tribromide, and benzyltrimethylammonium tribromide.

6. The ink solution of claim 1, wherein the tribromide salt is an ammonium tribromide salt.

7. The ink solution of claim 6, wherein the ammonium tribromide salt is trimethylphenylammonium tribromide.

8. The ink solution of claim 1, wherein:

A is selected from the group consisting of Cs, FA, and MA, or a combination thereof, and z is between 0.3 and 0.6.

9. The ink solution of claim 8, wherein:

A is Cs, FA, and MA, wherein the molar ratio of Cs to FA to MA is about 0.1:0.2:0.7; and z is 0.45.

10. The ink solution of claim 1, wherein the solvent is selected from the group consisting of dimethyl sulfoxide, dimethylformamide, dichloromethane, tetrahydrofuran, γ-butyrolactone, 2-methoxyethanol, N,N'-Dimethylpropyleneurea, N-methyl-2-pyrrolidone, and acetonitrile, or a combination thereof.

11. The ink solution of claim 1, wherein:

the composition of Formula I is $Cs_{0.1}FA_{0.2}MA_{0.7}PbI_{2.55}Br_{0.45}$; and the tribromide salt is trimethylphenylammonium tribromide, wherein the tribromide salt is present in the ink solution at a molar ratio of about 0.2% relative to the composition of Formula I.

12. A method for preparing a perovskite film using the ink solution of claim 1, comprising:

contacting the ink solution using a fast coating process onto a substrate to form a film, wherein the fast coating process is selected from the group consisting of blade coating, slot die coating, shear coating, gravure coating, brush coating, syringe coating, and screen printing.

13. The method of claim 12, wherein the fast coating process is blade coating.

14. The method of claim 12, wherein the perovskite film prepared has a thickness of about 300 nm to about 2000 nm.

* * * * *